United States Patent
Akamatsu et al.

(10) Patent No.: US 9,159,771 B2
(45) Date of Patent: Oct. 13, 2015

(54) ORGANIC EL PANEL AND MANUFACTURING METHOD THEREOF

(75) Inventors: Kaori Akamatsu, Osaka (JP); Seiji Nishiyama, Osaka (JP)

(73) Assignee: JOLED INC., Tokyo (JP)

(*) Notice: Subject to any disclaimer, the term of this patent is extended or adjusted under 35 U.S.C. 154(b) by 90 days.

(21) Appl. No.: 13/982,007

(22) PCT Filed: Dec. 2, 2011

(86) PCT No.: PCT/JP2011/006777
§ 371 (c)(1),
(2), (4) Date: Jul. 26, 2013

(87) PCT Pub. No.: WO2013/080264
PCT Pub. Date: Jun. 6, 2013

(65) Prior Publication Data
US 2013/0299813 A1    Nov. 14, 2013

(51) Int. Cl.
*H01L 27/32* (2006.01)
*H01L 51/56* (2006.01)
*H01L 51/50* (2006.01)

(52) U.S. Cl.
CPC .......... *H01L 27/32* (2013.01); *H01L 27/3246* (2013.01); *H01L 51/5088* (2013.01); *H01L 51/56* (2013.01); *H01L 51/5096* (2013.01)

(58) Field of Classification Search
CPC ..................................... H01L 27/32
See application file for complete search history.

(56) References Cited

U.S. PATENT DOCUMENTS

| | | |
|---|---|---|
| 5,294,869 A | 3/1994 | Tang et al. |
| 5,443,922 A | 8/1995 | Nishizaki et al. |
| 5,688,551 A | 11/1997 | Littman et al. |
| 2001/0054867 A1* | 12/2001 | Kubota .................. 313/504 |
| 2010/0252857 A1* | 10/2010 | Nakatani et al. ........... 257/100 |

FOREIGN PATENT DOCUMENTS

| | | |
|---|---|---|
| JP | 5-163488 | 6/1993 |
| JP | 3369615 | 11/2002 |
| JP | 3789991 | 4/2006 |
| JP | 2007-242911 | 9/2007 |
| JP | 2010-108921 | 5/2010 |
| WO | 2009/075075 | 6/2009 |

OTHER PUBLICATIONS

International Search Report, mailed Feb. 28, 2012, in corresponding International Application No. PCT/JP2011/006777.

* cited by examiner

*Primary Examiner* — Lex Malsawma
(74) *Attorney, Agent, or Firm* — Greenblum & Bernstein, P.L.C.

(57) ABSTRACT

The present invention is to provide an organic EL panel that is able to prevent the problems resulting from the unnecessary bank residues at a relatively low cost and has excellent light-emitting characteristics and a long life, and manufacturing method of the organic EL panel. Specifically, an organic EL element is obtained by forming organic EL elements by sequentially laminating an anode, a transparent conductive film, a hole-injection layer, a buffer layer, an organic light-emitting layer, a cathode, and a passivation layer on one surface of a substrate. Each bank residue positioned on the surface of the hole-injection layer has a diameter not greater than 0.2 μm in one direction when the substrate is seen in plan view. Preferably, when the substrate is seen in plan view, the area of each bank residue is set to be not greater than 0.4 μm$^2$, or more preferably not greater than 0.04 μm$^2$.

12 Claims, 25 Drawing Sheets

ORGANIC EL PANEL AND MANUFACTURING METHOD THEREOF

TECHNICAL FIELD

The present invention relates to an organic EL panel and a manufacturing method thereof, and in particular to a technology for forming an excellent organic light-emitting layer via the wet process.

BACKGROUND ART

In recent years, progress is being made in research and development of diverse functional elements which involve the use of an organic semiconductor.

Organic EL elements are known as being one of the most common among such functional elements. An organic EL element is a current-driven light-emitting element, and commonly includes a pair of electrodes consisting of an anode and a cathode, and a functional layer containing organic material disposed between the pair of electrodes. The functional layer includes layers such as an organic light-emitting layer and a buffer layer. Further, there are cases where a hole-injection layer is disposed between the functional layer and the anode. The hole-injection layer is disposed for injecting holes to the functional layer. When driving the organic EL element, voltage is applied between the pair of electrodes. The emission of light from the organic EL element is caused by an electric-field light-emitting phenomenon taking place as a result of the recombination of holes which are injected from the anode to the functional layer, and the electrons which are injected from the cathode to the functional layer. Now, more attention is being given to the application of organic EL elements as a light-emitting element or a light source for various display devices. This owes to the advantageous characteristics of the organic EL element, which include: high visibility resulting from self-luminescence; and excellent shock resistance resulting from the fully solid-state structure thereof.

Organic EL elements can be largely divided into two types, according to the material used for forming the functional layer therein. The first type of organic EL elements is a vapor deposition type. A vapor deposition-type organic EL element has a functional layer that is mainly composed of organic low molecular material and that is formed as a film by applying a vacuum process such as a vapor deposition method. The second type of organic EL elements is an application type. An application-type organic EL element has a functional layer that is mainly composed of ink including either organic high molecular material, or organic high molecular material having an excellent thin film forming property, and that is formed as a film by applying a wet process in which the ink is applied and dried, such as an inkjet method and a gravure printing method.

Nowadays attempts are being made to realize the manufacturing of larger organic EL panels by using application-type organic EL elements. As already described in the above, a functional layer is formed by applying ink including specific material via a wet process in an application-type organic EL element. In the application of the wet process, the precision with which the application of functional layer material of the respective colors to corresponding positions on the substrate is performed is not influenced by the size of the substrate. Hence, the technical barrier to be overcome in realizing the manufacturing of larger organic EL panels is relatively low.

CITATION LIST

Patent Literature

Patent Literature 1

Japanese Patent Publication No. 3369615

Patent Literature 2

Japanese Patent Publication No. 3789991

SUMMARY OF INVENTION

Technical Problem

The organic EL panel includes banks partitioning a plurality of organic EL elements either individually or into groups. The banks are made from an insulating material. The banks are formed by uniformly forming an insulating material layer on the surface of the substrate and removing unnecessary part by etching. At this time, bank residues remaining in a light-emitting region is problematic since the residues might cause degradation of luminous efficiency and shorten life of the organic EL panel.

For example, when the bank forming process is performed after forming the hole-injection layer, the bank residues remain on the surface of the hole-injection layer in the light-emitting region. The bank residues are insulative, and acts as a parasitic capacitance film (capacitor) at an interface between the first electrode (anode) and the hole-injection layer. FIG. 4 is a schematic cross-sectional view showing such bank residues (denoted by BNK residues). In FIG. 4, a parasitic capacitance film is formed by the residues adhering to the surface of the hole-injection layer (HIL).

The parasitic capacitance film causes electrons that should cause carrier recombination near an interface between the organic light-emitting layer and other functional layers (IL) to infiltrate the IL, and this increases electron current density of the IL. This might degrade the IL and decrease life of the whole organic EL panel.

Further, since carrier recombination does not occur adequately, luminous efficiency decreases, and other problems such as increase of driving voltage also occur.

One method of removing bank residues is forming the banks after forming a peeling layer on the substrate, and removing the peeling layer to remove the bank residues. However, this method adds a new process to the processes of manufacturing the organic EL panel and might lower the yield. Also, the method might increase production costs.

Further, although another method that has been proposed involves resolving and removing the bank residues by exposing the bank surface to an energy ray such as ultraviolet rays (UV), when the bank surface is simply exposed to an energy ray, liquid repellency of the bank surface is lost. In such cases, it becomes difficult to adequately dispose ink in the organic light-emitting layer, for example.

Such a problem might similarly occur when the bank residues attach to the surface of the hole-injection layer or any other layer, and needs to be solved.

The present invention has been achieved in view of the above problems, and an aim thereof is to provide an organic EL panel that prevents the problems resulting from the unnecessary bank residues at a relatively low cost and has excellent light-emitting characteristics and long life, and manufacturing method of such as organic EL panel.

Solution to Problem

In order to solve the above problem, one aspect of the present invention provides an organic EL panel comprising: a substrate; a plurality of first electrodes disposed above the substrate along a first direction and a second direction, the first direction and the second direction intersecting each other; organic light-emitting layers each disposed above one of the first electrodes and including organic light-emitting material; banks partitioning the organic light-emitting layers either individually or into groups; and a second electrode disposed over the organic light-emitting layers, wherein a plurality of bank residues remain between the first electrodes and the organic light-emitting layers, and a diameter of each bank residue in one direction in plan view of a surface of the substrate is not greater than 0.2 μm.

Advantageous Effects of Invention

Intensive studies by the present inventors have revealed that even when the bank residues are not completely removed, if the diameter or area of each bank residue is reduced to a certain diameter or area, the organic EL panel has the same capability as when the bank residues are completely removed. The organic EL panel, which is one aspect of the present invention, is created according to this new knowledge, and secures that the diameter of each bank residue in one direction is not greater than 0.2 μm when the surface of the substrate is seen in plan view.

According to this structure, even if the bank residues positioned above the first electrode act as a parasitic capacitance film when driven, the amount of electrons stored in the parasitic capacitance film can be effectively reduced. Therefore, the luminous efficiency can be maintained. Further, electron current density of a layer that faces bank residues and is positioned above the first electrode (e.g., hole injection transporting layer, buffer layer) can be reduced so as to prevent the deterioration of such layer.

As a result of this, it is possible to provide excellent light-emitting characteristics and a long life of the organic EL panel.

As described above, the organic EL panel, which is one aspect of the present invention, can be realized at a relatively low cost since the bank residues are not required to be completely removed and are merely reduced to a certain value in area, and accordingly has excellent viability. Further, the bank surface is not required to be irradiated with a strong energy ray for a long time so as to completely remove the bank residues, and accordingly liquid repellency of the bank surface is not lost.

DESCRIPTION OF EMBODIMENTS

Figure 1:
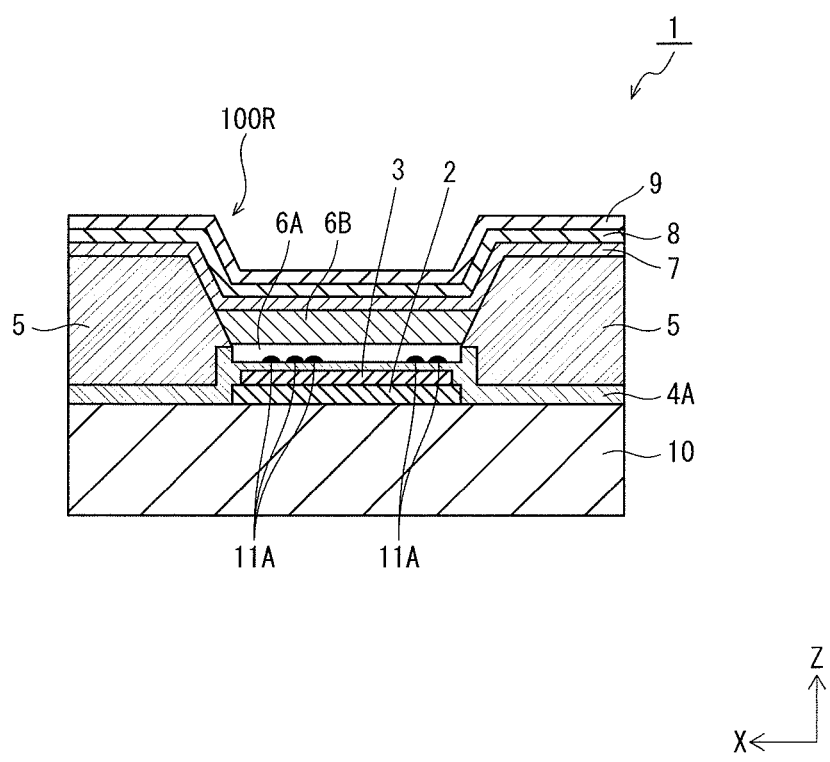
FIG. 1 is a schematic cross-sectional view showing the structure around an organic EL element 100R in an organic EL panel 1 pertaining to Embodiment 1.

<Outline of an Aspect of the Present Invention>

An organic EL panel according to an aspect of the present invention comprises: a substrate; a plurality of first electrodes disposed above the substrate along a first direction and a second direction, the first direction and the second direction intersecting each other; organic light-emitting layers each disposed above one of the first electrodes and including organic light-emitting material; banks partitioning the organic light-emitting layers either individually or into groups; and a second electrode disposed over the organic light-emitting layers, wherein a plurality of bank residues remain between the first electrodes and the organic light-emitting layers, and a diameter of each bank residue in one direction in plan view of a surface of the substrate is not greater than 0.2 μm.

Here, as another aspect of the present invention, an area occupied by each bank residue in plan view of the surface of the substrate may be not greater than 0.4 μm$^2$.

In this case, as another aspect of the present invention, the area occupied by each bank residue may be not greater than 0.04 μm$^2$.

Also, an organic EL panel according to another aspect of the present invention comprises a hole-injection layer, wherein the hole-injection layer may be disposed between the first electrodes and the organic light-emitting layers, and the bank residues may exist on a surface of the hole-injection layer.

Also, as another aspect of the present invention, the bank residues may exist on a surface of each first electrode.

Also, an organic EL panel according to another aspect of the present invention comprises a hole-injection layer, wherein the hole-injection layer may be disposed between the first electrodes and the organic light-emitting layers, and the hole-injection layer may cover the bank residues.

Also, an organic EL panel according to another aspect of the present invention comprises a buffer layer, wherein the buffer layer may be disposed between the first electrodes and the organic light-emitting layers, and the buffer layer may cover the bank residues.

Also, as another aspect of the present invention, the organic light-emitting layers may include adjacent first, second and third organic light-emitting layers, and groups of the first, second and third organic light-emitting layers may be repeatedly disposed in the second direction above the first electrodes, the first, second and third organic light-emitting layers being different from one another in luminescent color, and the diameter of each bank residue existing below one of the first, second and third organic light-emitting layers that has a highest electron mobility may be smallest.

Also, as another aspect of the present invention, the one organic light-emitting layer that has the highest electron mobility may have a blue luminescent color.

Also, a manufacturing method of an organic EL panel according to an aspect of the present invention comprises the steps of: preparing a substrate; forming a plurality of first electrodes above the substrate along a first direction and a second direction, the first direction and the second direction intersecting each other; forming banks above the first electrodes; forming organic light-emitting layers each disposed above one of the first electrodes and including organic light-emitting material; and forming a second electrode over the organic light-emitting layers, the second electrode being different from the first electrode in polarity, and the manufacturing method further comprises the step of treating bank residues, after forming the banks and before forming the organic light-emitting layers, by irradiating bank residues existing above the first electrodes with ultra violet to reduce a diameter of each bank residue in one direction to not greater than 0.2 μm.

Here, as another aspect of the present invention, in the treatment of the bank residues, an area occupied by each bank residue in plan view of a surface of the substrate may be reduced to not greater than 0.4 μm$^2$.

Here, as another aspect of the present invention, in the treatment of the bank residues, an area occupied by each bank residue in plan view of the surface of the substrate may be reduced to not greater than 0.04 μm$^2$.

In the following, description is provided on an organic EL element pertaining to each embodiment of the present invention. Subsequently, results and analysis will be presented of experiments having been performed to assess the efficiency of the present invention.

Note that each figure is illustrated on a reduced scale different from the proportion of the actual sizes.

<Embodiment 1>
(Structure of Organic EL Element)

FIG. 1 is a schematic cross-sectional view showing the structure around an organic EL element 100R whose luminescent color is red in an organic EL panel 1 pertaining to Embodiment 1.

The organic EL element 100R includes: a hole-injection layer 4A; various functional layers (a buffer layer 6A and a light-emitting layer 6B, in this case); and a pair of electrodes composed of an anode 2 (first electrode) and a cathode 8 (second electrode). The hole-injection layer 4A and the functional layers are disposed one on top of the other, and are disposed between the pair of electrodes. Each of the functional layers contains functional material having a predetermined function. It should be noted that, although not illustrated in FIG. 1, in the organic EL panel 1, an organic EL element 100G whose luminescent color is green and an organic EL element 100B whose luminescent color is blue have the same layer structure as the organic EL element 100R, and the organic EL element 100R, the organic EL element 100G and the organic EL element 100B are partitioned by the banks 5 and a set of these elements 100R, 100G and 100B is repeatedly arranged in this order in an X direction.

Each of the organic EL elements 100R, 100G and 100B includes, as shown in FIG. 1 showing the structure of the organic EL element 100R, the anode 2, a transparent conductive film 3, the hole-injection layer 4, the buffer layer 6A, an organic light-emitting layer 6B, and the cathode 8 (composed of a barium layer 8A and an aluminum layer 8B), which are disposed in the stated order on one main surface (upper surface, in this case) of a substrate 10. The anode 2 and the cathode 8 are connected to an unillustrated voltage source DC to supply power to the organic EL elements 100R, 100G and 100B from the outside.

(Substrate 10)

The substrate 10 is the base material for the organic EL panel 1 and the organic EL element 100 and may be formed with an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

While not shown in the figures, TFTs (thin film transistors) are provided on the upper surface of the substrate 10 for driving the organic EL element 100.

(Anode 2)

The anode 2 is made of metal material (aluminum or aluminum alloy) with an excellent degree of reflection of visible light as a reflective metal film so as to supply power to the light-emitting layer, and efficiently emit light generated from the light-emitting layer in the upward direction. The "aluminum alloy" mentioned here is an alloy formed by adding, to aluminum, at least one of iron, copper, manganese, zinc, nickel, magnesium, palladium, cobalt and neodymium.

(Transparent Conductive Film 3)

The transparent conductive film 3 is made of a known transparent conductive material, such as ITO and IZO. The transparent conductive film 3 is disposed to cover the anode 2 to insulate oxygen, etc., in the atmosphere, and prevent reflectivity and conductivity of the anode 2 from lowering due to the formation of an unnecessary film.

Note that, in the organic EL elements 100R, 100G and 100B, when the anode 2 is made of a thin silver film, for example, the transparent conductive film 3 is formed so as to obtain excellent connectivity among layers. When the anode 2 is made of aluminum material, the connectivity among layers is excellent. Therefore, the transparent conductive film 3 may be omitted in this case.

(Hole-Injection Layer 4A)

The hole-injection layer 4A is a layer that efficiently transfers holes to the organic light-emitting layer 6B. The hole-injection layer 4A is formed of metal oxide such as molybdenum oxide, molybdenum tungsten oxide, etc., but is not limited to this.

(Banks 5)

The banks 5 are, for example, composed of an insulative organic material (such as acrylic resin, polyimide resin, novolac-type phenolic resin, and the like), and at least the surface thereof has liquid repellency. In the panel 100, in order to adopt a line bank structure as the shape of the banks 5, the banks are disposed to have a trapezoidal cross-section in the width (X) direction and linearly extend in a Y direction (in a direction perpendicular to the sheet of FIG. 1). A plurality of banks 5 are arranged in parallel at a specific pitch in the width (X) direction in the panel 100.

During the bank forming process at the time of manufacturing, patterning is applied to form the banks 5 through a predetermined process. Part of material used in this process remains on the surface of the hole-injection layer 4A to be bank residues 11A. In FIG. 1, the bank residues 11A are shown larger than their actual size for the sake of explanation.

(Buffer Layer 6A)

The buffer layer 6A is a 20 nm-thick layer formed of TFB (poly(9,9-di-n-octylfluorene-alt-(1,4-phenylene-((4-sec-butylphenyl)imino)-1, 4-phenylene)) that is an amine-containing organic polymer. In Embodiment 1, the buffer layer is shown as an example of an IL layer.

The buffer layer 6A may be omitted, and the organic light-emitting layer 6B may be directly layered on the hole-injection layer 4A.

In some cases, the buffer layer serves as an electron block layer that prevents the intrusion of electrons into the hole-injection layer.

(Organic Light-Emitting Layer 6B)

The organic light-emitting layer 6B is formed by organic light-emitting material that corresponds with any of luminescent colors of red (R), green (G) and blue (B). The organic light-emitting layer 6B has the thickness of approximately 70 nm. The organic light-emitting material is F8BT (poly(9,9-di-n-octylfluorene-alt-benzothiadiazole)), which is an organic polymer, but not limited to this. For example, the organic light-emitting material is a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrilium compound, selenapyrylium compound, tellurapyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

(Electron Transport Layer 7)

The electron transport layer 7 has the function of efficiently transporting, to the light-emitting layer 5, electrons injected from the cathode 8. The electron transport layer 7 is an organic compound layer, for example, and formed of two different organic substances (first organic substance as an electron transport material (host), and second organic substance as an n-type dopant).

(Cathode 8)

The cathode 8 is formed of indium tin oxide (ITO), indium zinc oxide (IZO), for example. Since the panel 100 is a top emission type organic EL panel, the cathode 8 is required to be formed of a transparent material.

Note that an electron transport layer may be disposed between the organic light-emitting layer 6B and the cathode 8.

(Passivation Layer 9)

A passivation layer 9 is formed of a material such as silicon nitride (SiN) and silicon oxynitride (SiON), and used in order to suppress the light-emitting layer 6 from deteriorating in reaction to moisture and air. When the organic EL element is a top-emission type organic EL element, the passivation layer 9 is preferred to be formed of a transparent material.

Figure 2:
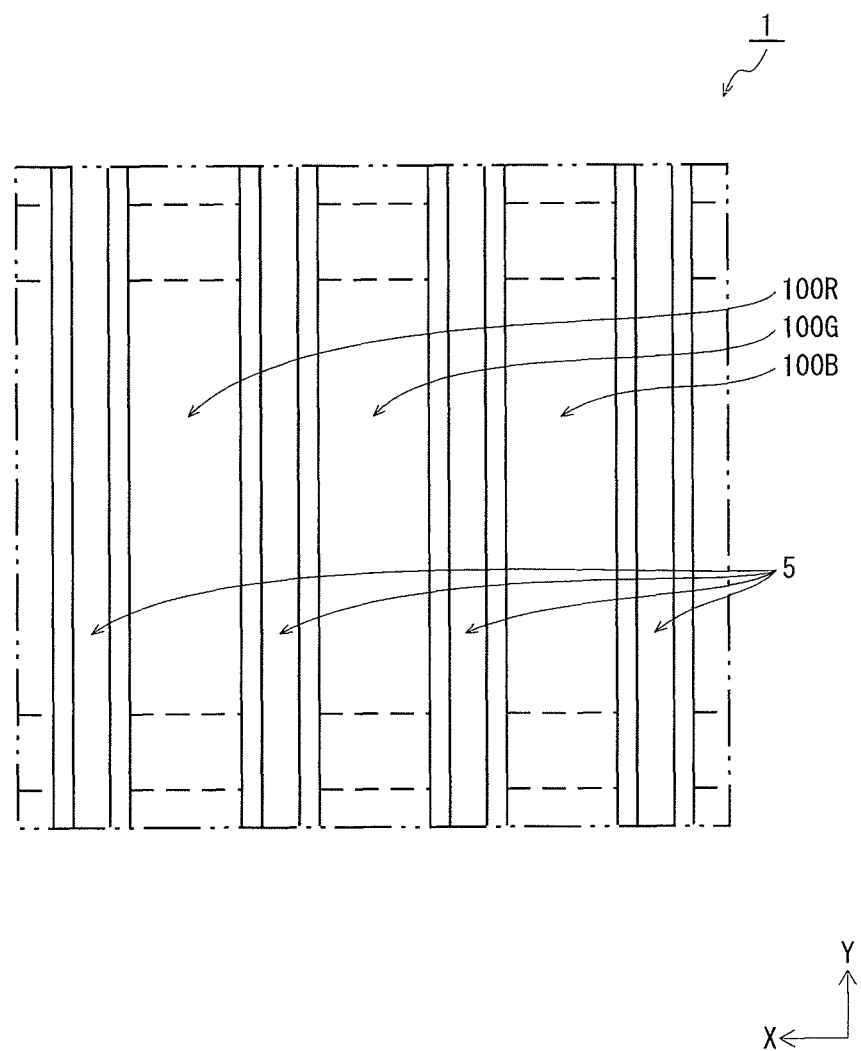
FIG. 2 is a front view of part of the organic EL panel 1.

The organic EL elements 100R, 100G and 100B with the above structure are, as shown in FIG. 2 showing a front view of part of the organic EL panel 1, partitioned by the banks 5 with the line bank structure whose longitudinal direction is the Y direction, and repeatedly formed in the X direction. In the organic EL panel 1, each organic EL element 100R, 100G or 100B functions as a sub-pixel, and three adjacent organic EL elements in one-to-one correspondence with colors of RGB, i.e., three organic EL elements 100R, 100G and 100B constitute a pixel as a whole. This realizes full-color display.

(Effects and Advantages Produced by Organic EL Panel 1)

Figure 3A:
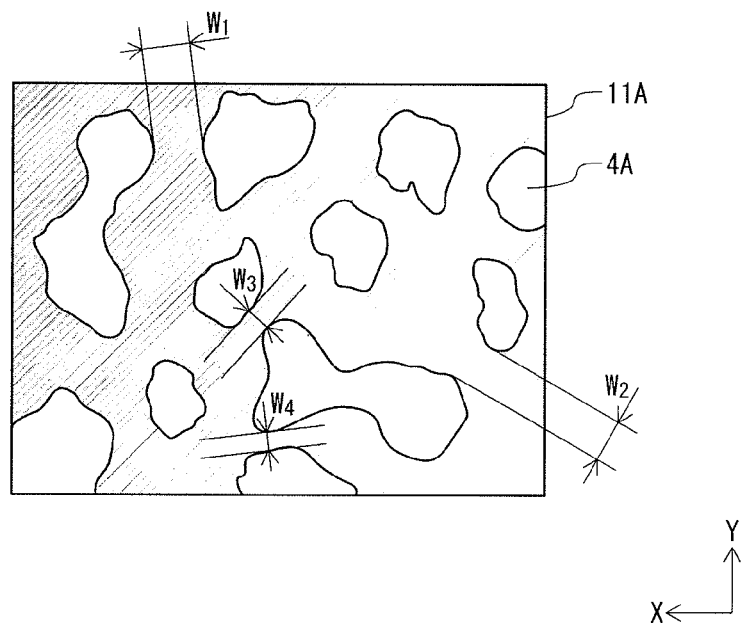
FIGS. 3A and 3B are each a schematic view showing bank residues when the organic EL panel 1 is seen in plan view.
Figure 3B:
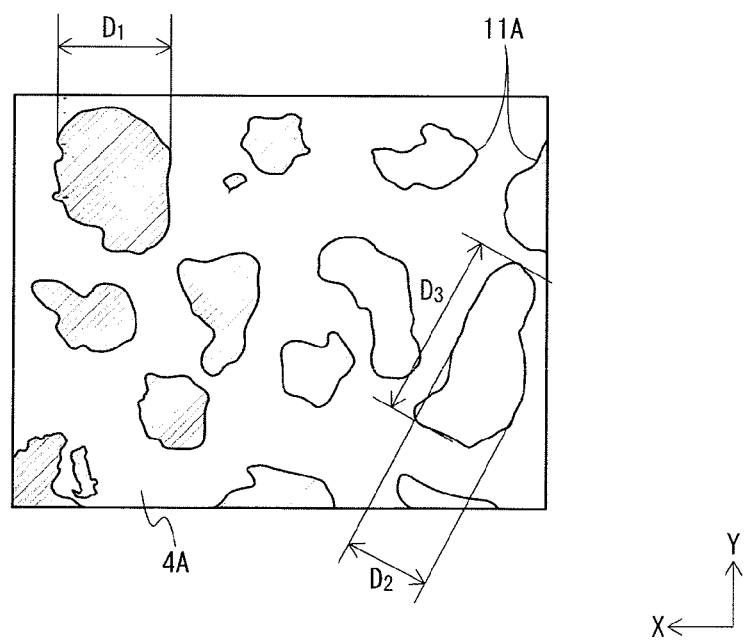

FIG. 3A is a schematic view showing the surface of the hole-injection layer 4A seen in plan view. Generally, in an organic EL panel, one or more bank residues produced when patterning is applied to form the banks 5 remain on the surface of an exposed layer of the organic EL element. In FIG. 3A, a bank residue 11A remains in the form of a net on the surface of hole-injection layer 4A. Alternatively, in some cases, one or more bank residues 11A have an isolated or discontinuous distribution, as shown in FIG. 3B.

Figure 4:
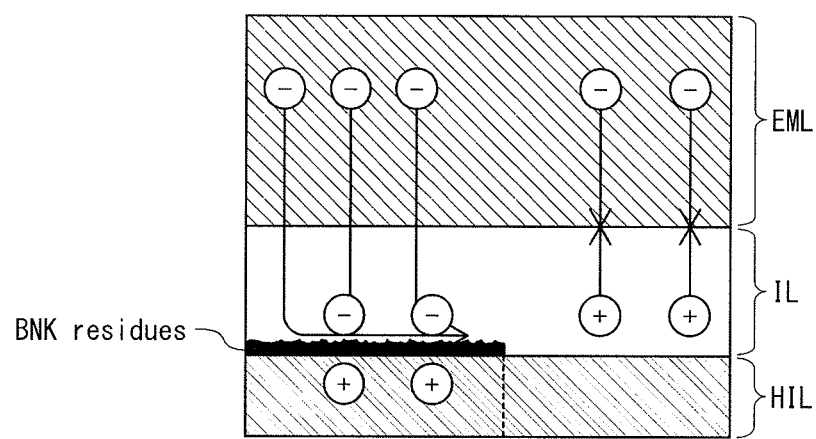
FIG. 4 is a view for explaining the effect given by bank residues to flow of carriers.

As shown in FIG. 4, the bank residues 11A located at an interface between the transparent conductive film 3 and the hole-injection layer 4A act as a so-called parasitic capacitance film (capacitor) when the panel is driven. That is, in the organic EL elements 100R, 100G and 100B, the bank residues 11A increase the electric field of IL (buffer layer 6A, in this case) disposed directly above the hole-injection layer 4A, and as a result, electrons in the organic light-emitting layer 6B are pulled to the buffer layer 6A. Since the buffer layer 6A lacks holes when driven, electrons are stored in the buffer layer 6A.

As a result of this, the electron current density in the buffer layer 6A abnormally increases, and this abnormal electron current density reduces luminous efficiency of each of the organic EL elements 100R, 100G and 100B, and shortens their lives.

In contrast, in the organic EL panel 1, the size of each of the bank residues 11A is controlled to be not greater than a predetermined value when the substrate 10 is looked down (seen in plan view) so as to prevent a problem resulting from the bank residues 11A.

After repeated and careful examination, the inventors arrived at the bank residues 11A having the following characteristics.

(i) When the substrate 10 is looked down (seen in plan view), each of the bank residues 11A has a diameter not greater than 0.2 μm in one direction thereof (in FIG. 3B, $D_1$, $D_2$, $D_3$, etc.). Note that when a bank residue 11A is relatively continuous, as shown in FIG. 3A, the shortest distance from any position on the bank residues 11A to the periphery thereof (in FIG. 3A, width of $W_1$, $W_2$, $W_3$ or $W_4$, for example) is set to be not greater than 0.2 μm.

(ii) In addition to (i), when the substrate 10 is looked down (seen in plan view), the area of each bank residue 11A is not greater than 0.4 $μm^2$. More preferably, the area is not greater than 0.04 $mm^2$.

As a result of this, even when the bank residues 11A act as a parasitic capacitance film when the panel is driven, the negative influence caused by the parasitic capacitance film is minimized, and it is possible to drive the organic EL panel 1 having the luminous efficiency that is substantially equivalent to the case in which the bank residues do not exist.

Further, it is possible to suppress increase in the electron current density in the buffer layer 6A that covers the bank residues 11A. Accordingly deterioration of the buffer layer 6A due to excess electrons is prevented, and a long life for each of the organic EL elements 100R, 100G and 100B is promoted.

As a result, the whole organic EL panel 1 is provided with excellent light-emitting characteristics and a long life.

As described above, the organic EL panel 1 of Embodiment 1 can be realized at a relatively low cost by appropriately controlling the area of the bank residues without completely removing the bank residues unlike a conventional configuration. Therefore, the organic EL panel 1 has the high feasibility.

Further, although UV irradiation is performed to control the size of the bank residues 11A, it is unnecessary to project the strong energy ray for a long time so as to completely remove the bank residues. Thus, liquid repellency of the surface of the banks 5 is not lost.

During a manufacturing process of organic EL panels, the bank forming process is performed at different timings. The uppermost surface of the substrate immediately before the bank forming process is any of an anode, a transparent conductive film, a hole-injection layer, a buffer layer, etc. After the bank forming process is performed, bank residues remain on the uppermost surface. When at least a layer layered on the bank residues has a higher hole mobility than that of the organic light-emitting layer, the same effect as that of Embodiment 1 is expected.

In particular, in the case of layering the hole transport layer on the bank residues, the hole transport layer is likely to be deteriorated when the electron current density of the hole transport layer increases. Hence, by controlling the size of the bank residues based on the present invention, increase in the electron current density in the hole transport layer can be suppressed, and a long life of the organic EL panel and an increase in the luminous efficiency can be expected.

Further, during investigation, the present inventors have revealed that the electron current density (electron-storage capacity) of a layer layered on the bank residues increases in proportion to an electron mobility of the organic light-emitting layer. The organic light-emitting layer whose luminescent color is blue has higher electron mobility than organic light-emitting layers with different luminescent colors. Therefore, when the hole-injection layer is layered on the bank residues in the blue organic EL element, the electron-storage capacity in the hole-injection layer is particularly high.

By applying Embodiment 1, problem resulting from the bank residues can be effectively reduced even from the blue organic EL element. Let the diameter in one direction in each of the bank residues 11A be not greater than 0.2 μm. In this case, the electron current density of the hole-injection layer layered on the bank residues 11A is substantially equivalent to that of the case where the bank residues 11A do not exist. Therefore, deterioration of the hole-injection layer is effectively prevented.

Further, in order that the organic EL element whose luminescent color is blue obtains an excellent effect, the area of each bank residue is preferred to be as small as possible, i.e., not greater than 0.04 $μm^2$, in addition to control of the diameter of the bank residues.

<Embodiment 2>

Figure 10:
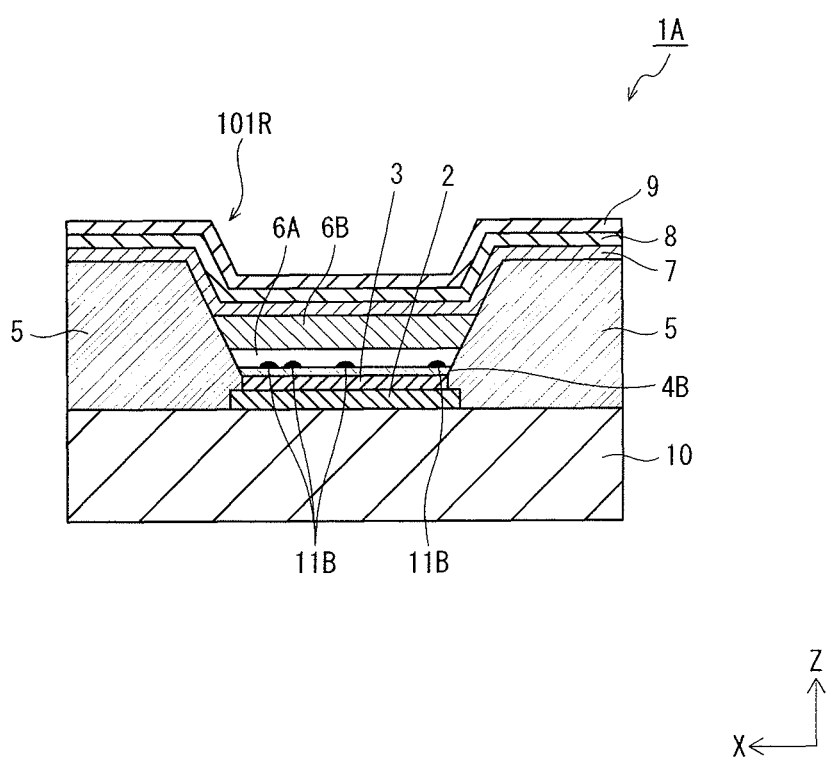
FIG. 10 is a schematic cross-sectional view showing the structure around an organic EL element 101R in an organic EL panel 1A pertaining to Embodiment 2.

FIG. 10 is a schematic cross-sectional view showing the structure around an organic EL element 101R whose luminescent color is red in an organic EL panel 2 pertaining to Embodiment 2.

The structure shown in FIG. 10 is generally the same as the structure of the organic EL panel 1 except that a hole-injection layer 4B is limited to be disposed on the transparent conductive film 3. According to this structure, since the banks 5 are formed immediately after the anode 2 and the transparent conductive film 3 are formed, bank residues 11B remain on the surface of the transparent conductive film 3 and are covered by the hole-injection layer 4B. The hole-injection layer 4B is formed, in a light-emitting region partitioned by the banks 5, by a wet process in which ink is dripped and dried.

In the organic EL panel 1A with the above structure, UV irradiation is performed under a predetermined condition at the time of manufacturing so that bank residues have the same small area and diameter as the bank residues 11A. As a result of this, the negative influence caused by the bank residues 11B acting as the parasitic capacitance film is reduced, and it is possible to obtain excellent luminous efficiency and reduce power consumption.

<Experiments Conducted to Confirm Performance and Observations>

The following sequentially describes methods, results and observations of experiments conducted to confirm performance of the present invention.

(Electron Current Density in IL)

Here, distribution of the electron current density in IL that covers the bank residues was considered.

Figure 12:
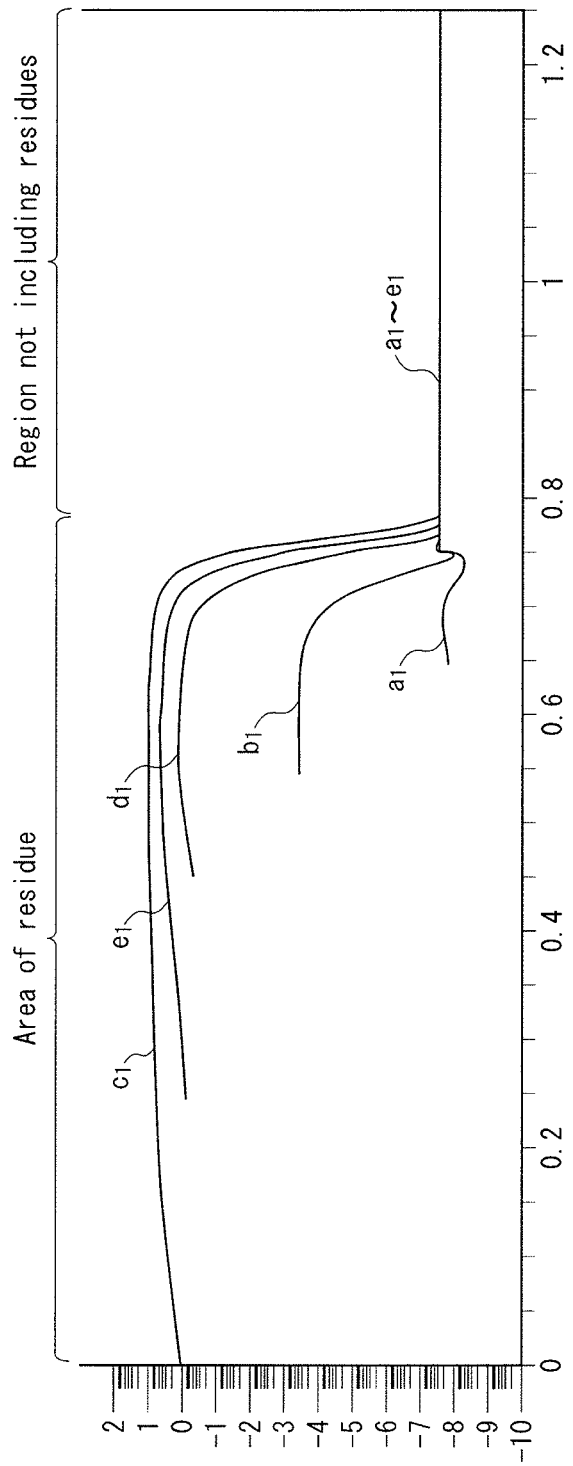
FIG. 12 shows the result of a one-dimensional measurement showing a distribution of electron current density of an organic EL element (R).
Figure 13:
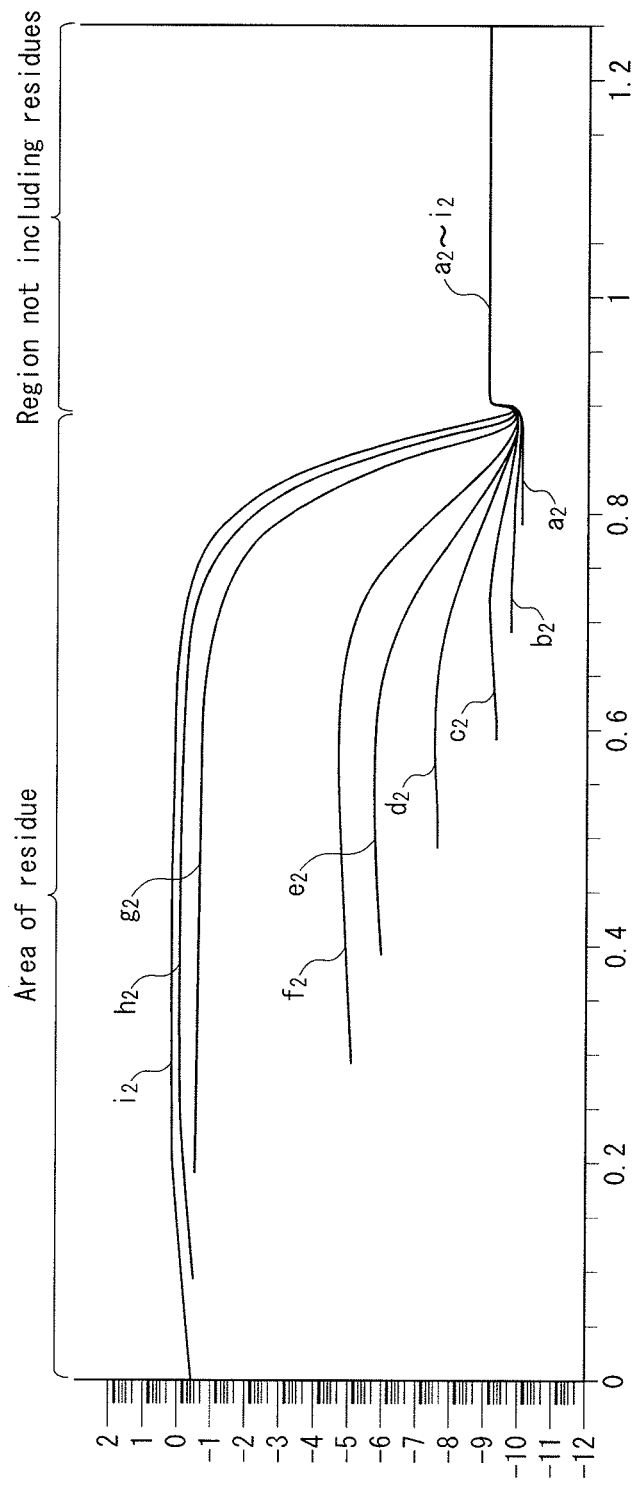
FIG. 13 shows the result of a one-dimensional measurement showing a distribution of electron current density of an organic EL element (G).
Figure 14:
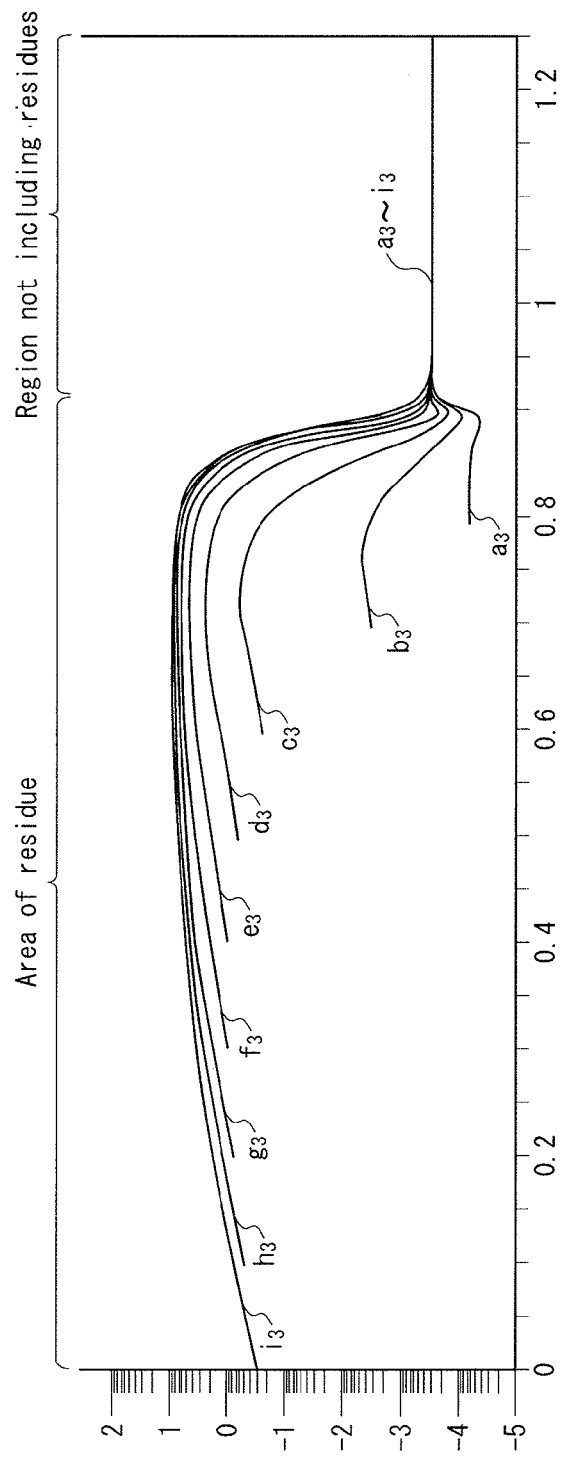
FIG. 14 shows the result of a one-dimensional measurement showing a distribution of electron current density of an organic EL element (B).

FIGS. 12, 13 and 14 show graphs showing the results of one-dimensional measurements of sample elements prepared as a red organic EL element, a green organic EL element, and a blue organic EL element, respectively. Each graph shows electron current densities in an area of a residue and in a region not including residues on the surface of the IL layer. The sample elements have a bipolar device (BPD) structure.

In each figure, each curve of the sample elements a1-e1, a2-i2 and a3-i3 shows changes in the electron current density when each element is driven at 10 V in the case where the width of a bank residue and the width of an opening (width of a region not including residues) are set based on the conditions of the following Tables 1-3.

In the following, "width of residue" of the banks indicates "the largest diameter of an area of residue".

TABLE 1

Red organic EL element

| Sample | Width of Residue (μm) | Width of Opening (μm) |
|---|---|---|
| a1 | 0.1 | 0.1 |
| b1 | 0.2 | 0.2 |
| c1 | 0.75 | 0.75 |
| d1 | 0.3 | 0.3 |
| e1 | 0.5 | 0.5 |

TABLE 2

Green organic EL element

| Sample | Width of Residue (μm) | Width of Opening (μm) |
|---|---|---|
| a2 | 0.1 | 0.9 |
| b2 | 0.2 | 0.8 |
| c2 | 0.3 | 0.7 |
| d2 | 0.4 | 0.6 |
| e2 | 0.5 | 0.5 |
| f2 | 0.6 | 0.4 |
| g2 | 0.7 | 0.3 |
| h2 | 0.8 | 0.2 |
| i2 | 0.9 | 0.1 |

TABLE 3

Blue organic EL element

| Sample | Width of Residue (μm) | Width of Opening (μm) |
|---|---|---|
| a3 | 0.1 | 0.9 |
| b3 | 0.2 | 0.8 |
| c3 | 0.3 | 0.7 |
| d3 | 0.4 | 0.6 |
| e3 | 0.5 | 0.5 |
| f3 | 0.6 | 0.4 |
| g3 | 0.7 | 0.3 |
| h3 | 0.8 | 0.2 |
| i3 | 0.9 | 0.1 |

Each graph shown in FIGS. 12-14 exhibits that the electron current density in an area of a bank residue becomes higher as the width of the bank residue increases. However, the electron current density in an area of a residue whose width is not greater than approximately 0.2 μm is almost the same as the electron current density in a region not including residues.

In contrast, changing the width of an opening did not have a significant effect on the electron current density compared to the case of changing the width of residues.

Figure 15:
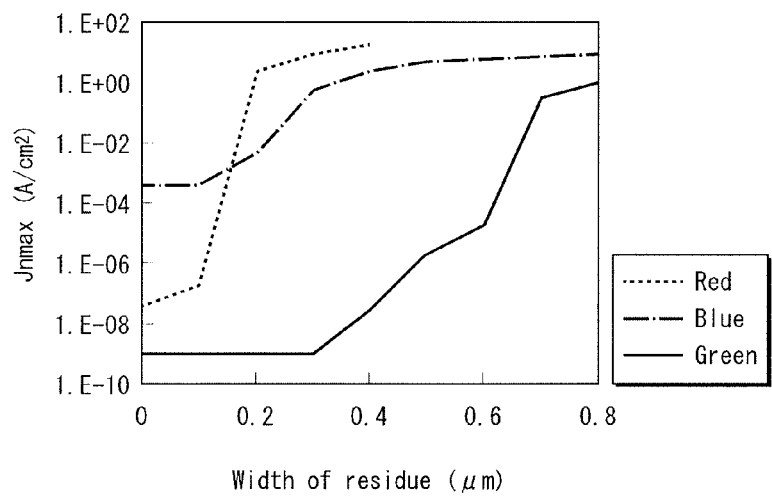
FIG. 15 shows a graph of the relationship between the width of a bank residue and electron current density in an area of the residue.

Next, a graph of the relationship between the electron current density and the width of the bank residues was prepared based on the data of FIGS. 12-14, and shown in FIG. 15. In FIG. 15, electron current density is on the vertical axis and the width of residues is on the horizontal axis.

The result shown in FIG. 15 exhibits that in the case of a blue or red element, the electron current density dramatically increases when the width of residues is approximately 0.1 μm or greater. In the case of a green element, the electron current density increases when the width of residues is approximately 0.3 μm or greater.

Accordingly, it is clear that if the width of residues in organic EL elements of RGB is uniformed to not greater than 0.2 μm, preferably not greater than 0.1 μm, the organic EL panel can prevent the increase in the electron current density due to bank residues in IL.

(Effect of Change in Width of Residues on Electron Current Density)

Figure 16:
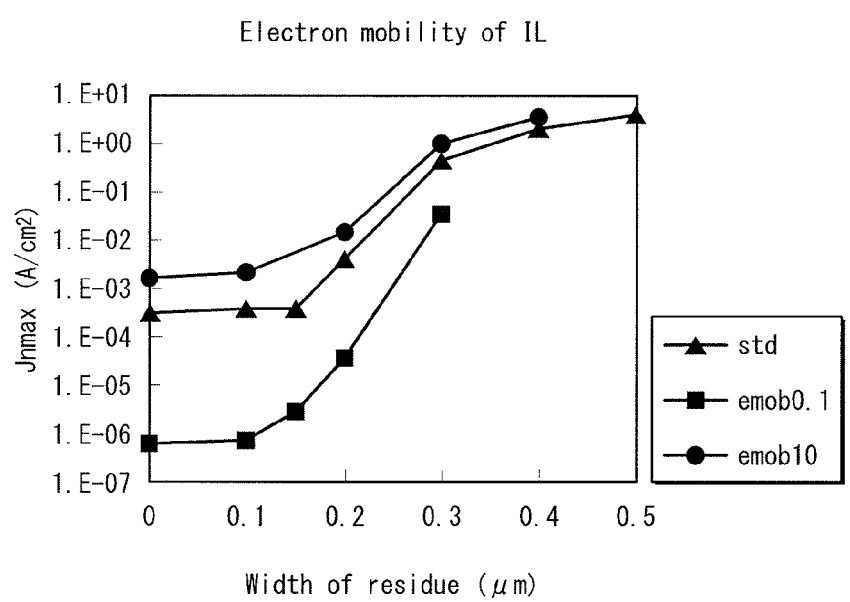
FIG. 16 shows a graph of the relationship between the width of a bank residue and electron current density in an area of the residue when electron mobility of IL is varied.

Next, change in the electron current density depending on an electron mobility in IL was simulated. FIG. 16 shows the result of the simulation. As sample elements, a standard element (std), an element whose electron mobility is 1/10 of that of the standard element (emob0.1), and an element whose electron mobility is 10 times that of the standard element (emob10) were analyzed.

It is clear from FIG. 16 that although the electron mobility of each element increases as the width of residues increases, the electron mobility hardly changes when the width of residues is not greater than 0.2 μm.

Figure 17:
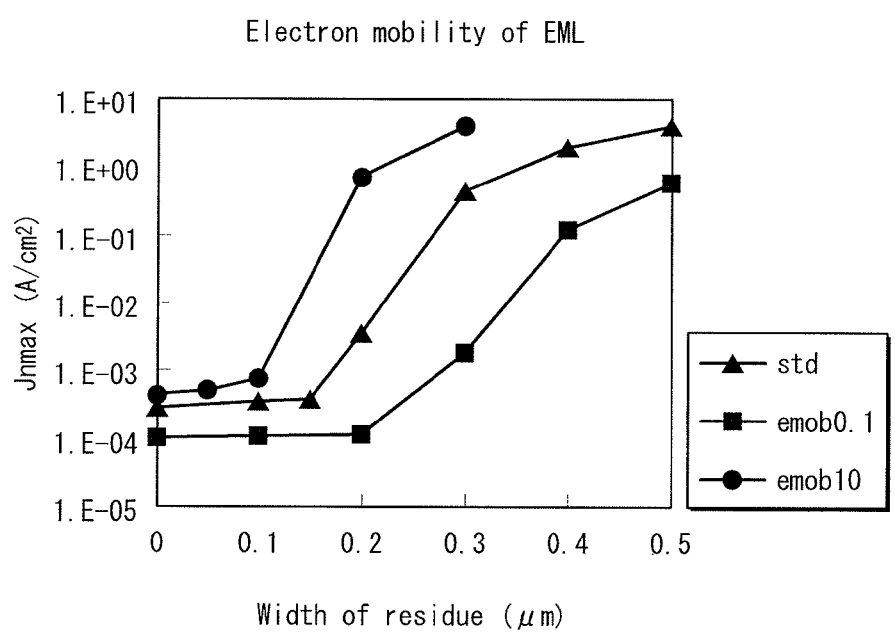
FIG. 17 shows a graph of the relationship between the width of a bank residue and electron current density in an area of the residue when electron mobility of EML is varied.

Next, change in the electron current density depending on an electron mobility in EML was simulated in the similar manner to FIG. 16. FIG. 17 shows the result of the simulation.

It is perceived that although the electron mobility of each element increases as the width of residues increases, change in the electron mobility is small when the width of residues is not greater than 0.2 μm, and change in the electron mobility is very small when the width of residues is not greater than 0.1 μm.

Figure 18:
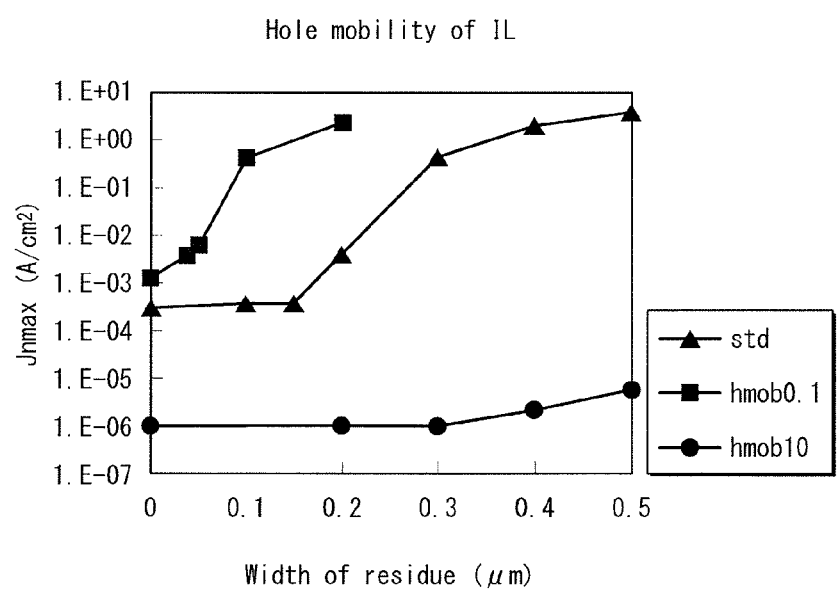
FIG. 18 shows a graph of the relationship between the width of a bank residue and electron current density in an area of the residue when hole mobility of IL is varied.

Next, change in the electron current density depending on a hole mobility in IL was simulated in the similar manner to FIG. 16. FIG. 18 shows the result of the simulation. As sample elements, a standard element (std), an element whose hole mobility is 1/10 of that of the standard element (hmob0.1), and an element whose hole mobility is 10 times that of the standard element (hmob10) were prepared.

Although the hole mobility of each element increases as the width of residues increases, increase in the hole mobility of the element whose hole mobility is 10 times that of the standard element (hmob10) is small. It is perceived that change in the hole mobility of each element is small when the width of residues is not greater than 0.2 μm, and change in the hole mobility of each element is very small when the width of residues is not greater than 0.05 μm.

Figure 19:
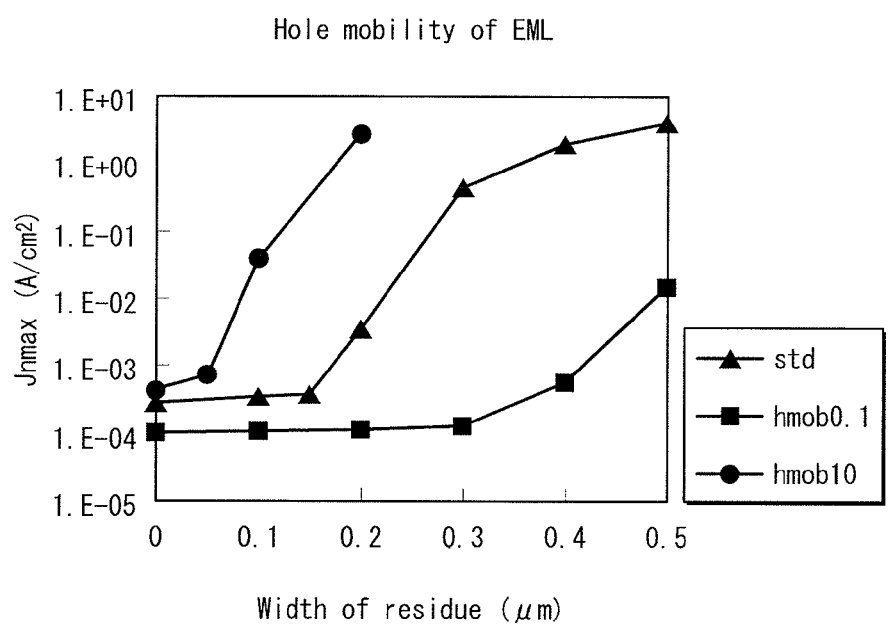
FIG. 19 shows a graph of the relationship between the width of a bank residue and electron current density in an area of the residue when hole mobility of EML is varied.

Next, change in the electron current density depending on a hole mobility in EML was simulated in the similar manner to FIG. 18. FIG. 19 shows the result of the simulation.

Although the hole mobility of each element increases as the width of residues increases, increase in the hole mobility of the element whose hole mobility is 10 times that of the standard element (hmob10) is small in a similar manner to the result of FIG. 18. It is perceived that change in the electron mobility is small when the width of residues is not greater than 0.2 μm, and change in the hole mobility is very small when the width of residues is not greater than 0.05 μm.

Figure 20:
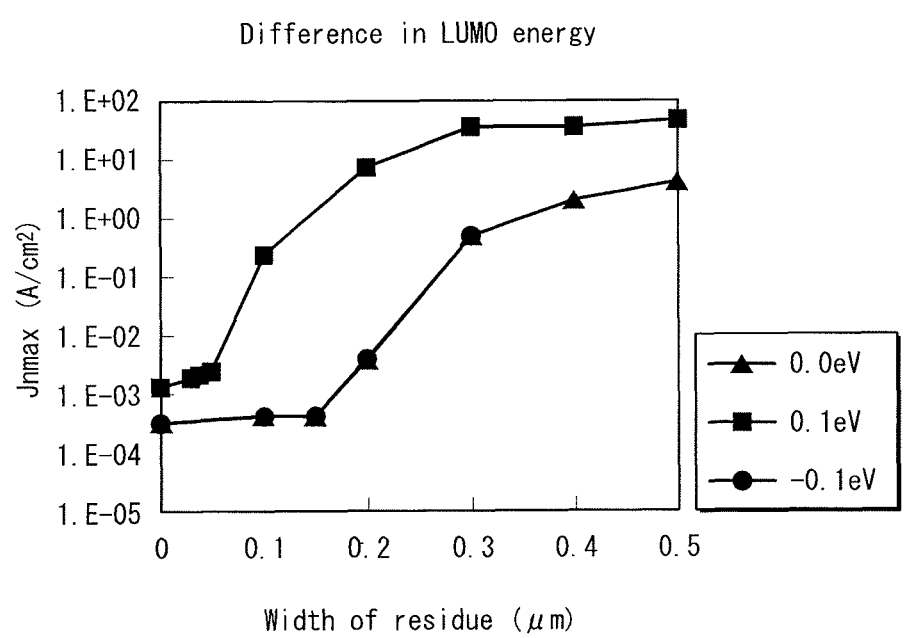
FIG. 20 shows a graph of the relationship between the width of a bank residue and electron current density in an area of the residue when the difference in LUMO energy between IL and EML is varied.

Next, change in the electron current density in IL when the difference in lowest unoccupied molecular orbital (LUMO) energy between IL and EML is varied was simulated. FIG. 20 shows the result of the simulation.

It was discovered from the result shown in FIG. 20 that change in the electron current density according to the width of residues is smaller as the difference in LUMO energy decreases. According to the samples shown in FIG. 20, it is considered that the width of residues reduced to not greater than 0.05 μm achieves the most reduction of the electron current density.

Figure 21:
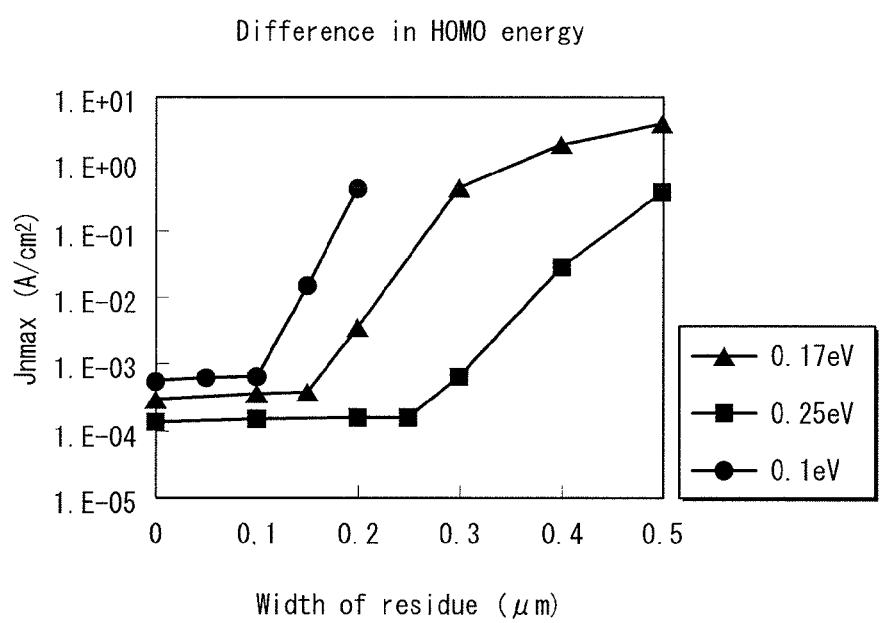
FIG. 21 shows a graph of the relationship between the width of a bank residue and electron current density in an area of the residue when the difference in HOMO energy between IL and EML is varied.

Next, change in the electron current density in IL when the difference in highest occupied molecular orbital (HOMO) energy between IL and EML is varied was simulated. FIG. 21 shows the result of the simulation.

According to the result shown in FIG. 21, the width of residues reduced to not greater than 0.1 μm most effectively suppresses a change in the electron current density. It can be said that as the difference in HOMO energy increases, increase in the electron current density in accordance with increase in the width of the residues is smaller.

Figure 22:
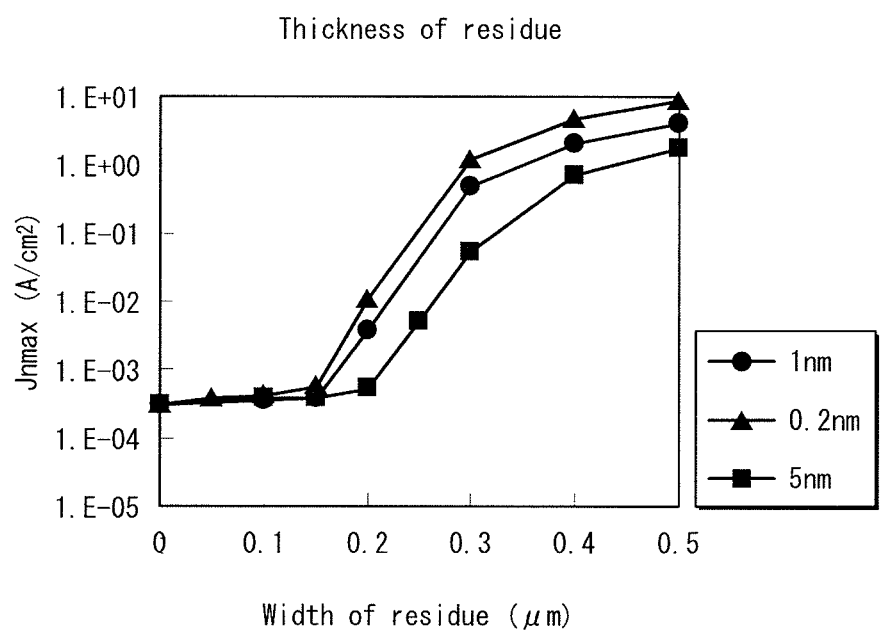
FIG. 22 shows a graph of the relationship between the width of a bank residue and electron current density in an area of the residue when the thickness of the bank residues is varied.

Next, change in the electron current density in IL when the thickness of bank residues is varied was simulated. FIG. 22 shows the result of the simulation.

Based on the result shown in FIG. 22, it can be said that the thickness of the residues did not have a significant effect on the electron current density in IL compared to the width of the residues. According to the results of the analyses, each sample can suppress change in the electron current density when the width of residues is not greater than approximately 0.2 μm.

(Distribution of Electron Current Density in Organic EL Element)

Figure 23:
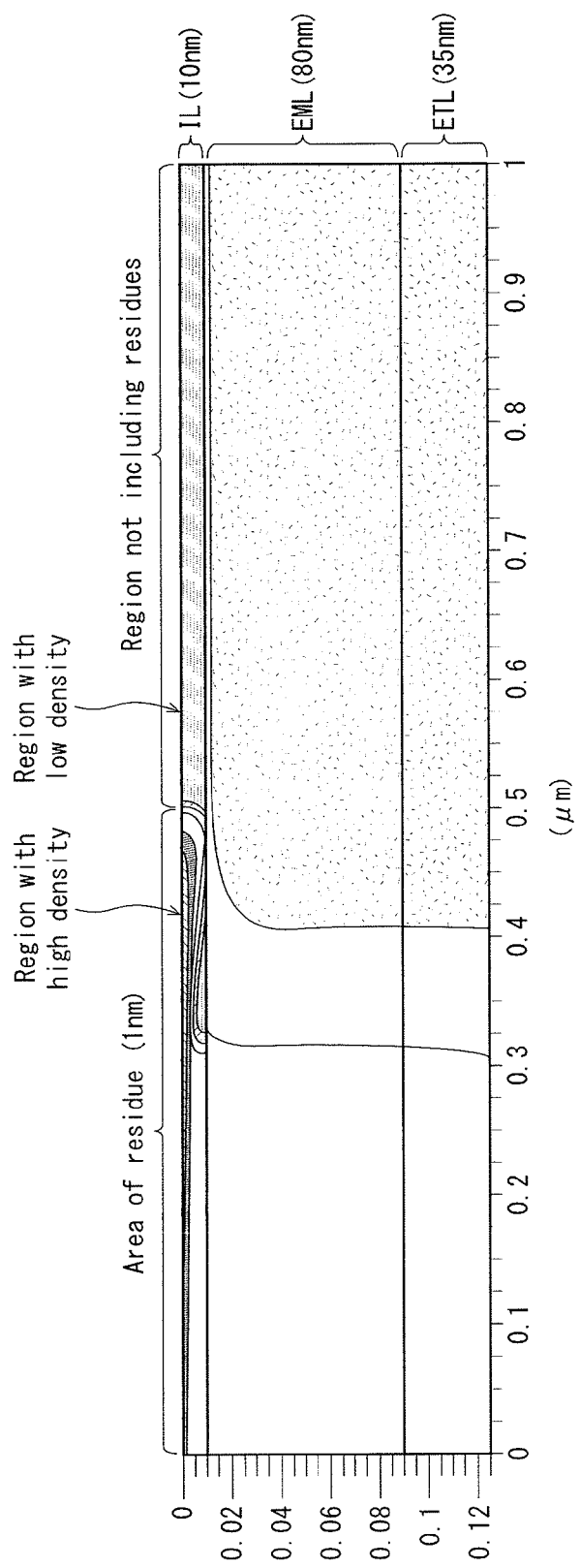
FIG. 23 shows a distribution of electron current density of each layer of an organic EL element (R).

FIG. 23 shows a distribution of electron current density of a red organic EL element formed by sequentially layering the IL layer, the organic light-emitting layer, and the electron transport layer between the anode and cathode. In FIG. 23, the electron transport layer (ETL), the organic light-emitting layer (EML) and the buffer layer (IL) are sequentially layered for the sake of convenience. The bank residues are 1 nm in thickness, and exist in the IL layer along the horizontal axis. The border of an area of a residue and a region not including residues is positioned near the center of the FIG. 23.

Figure 24:
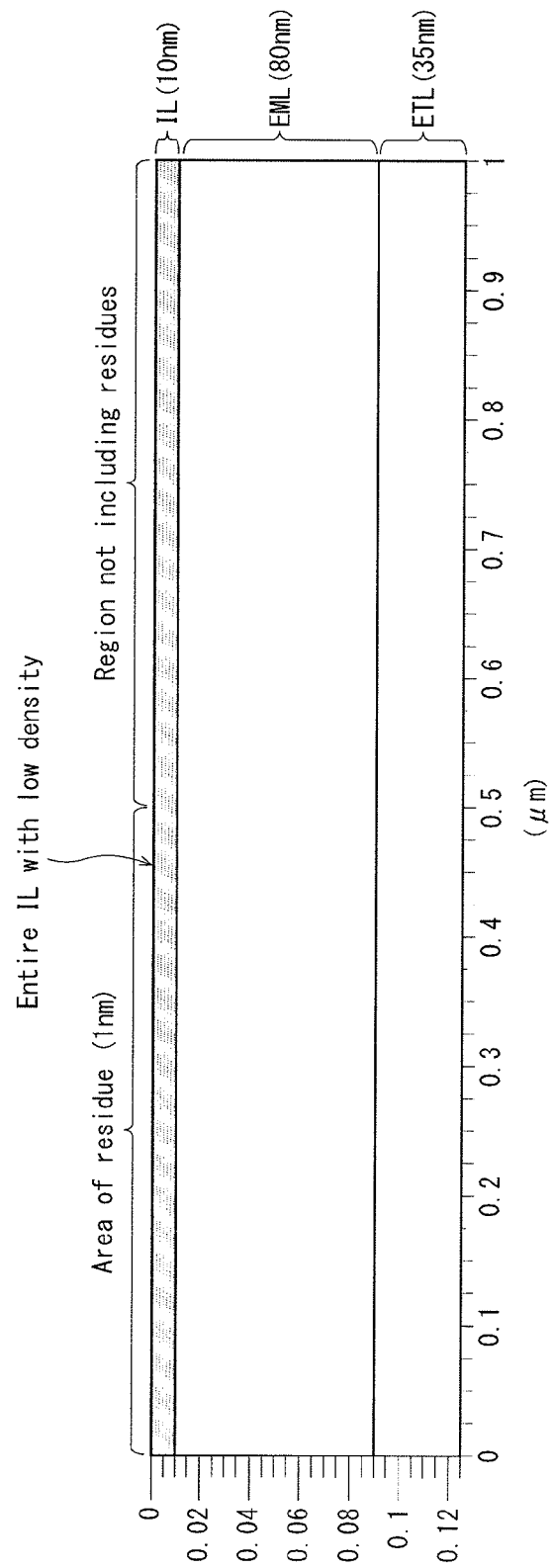
FIG. 24 shows a distribution of electron current density of each layer of an organic EL element (G).
Figure 25:
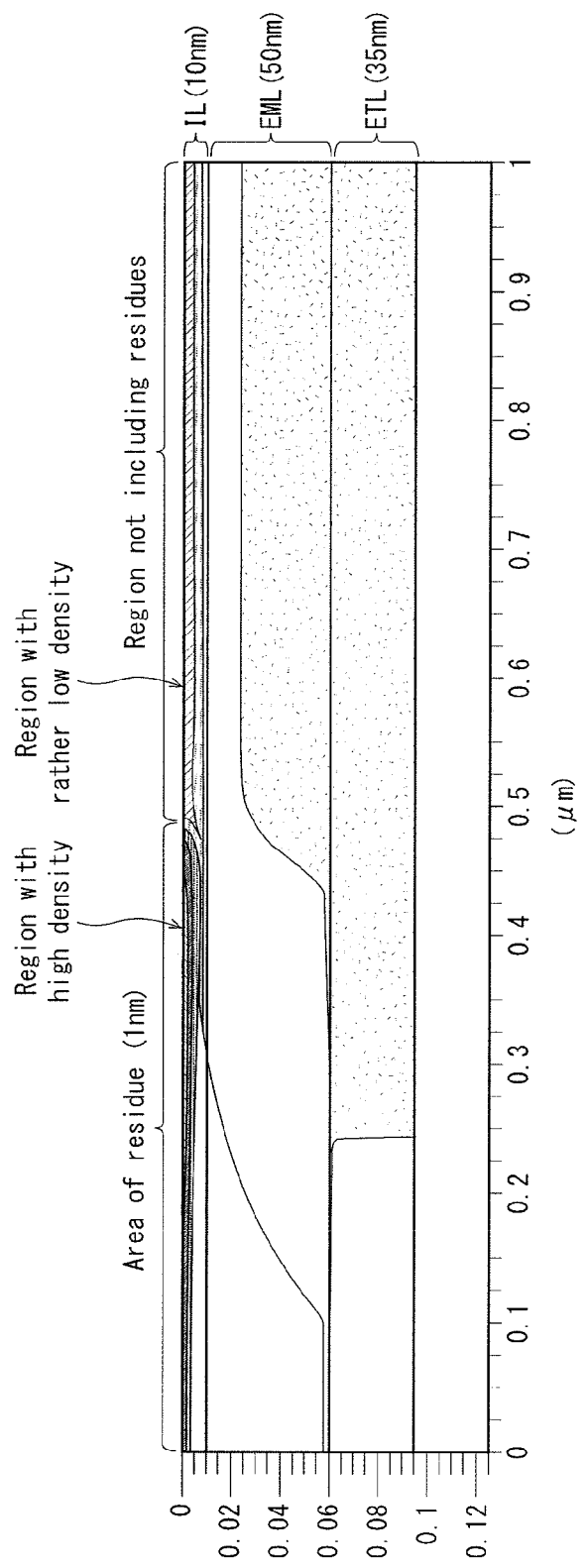
FIG. 25 shows a distribution of electron current density of each layer of an organic EL element (B).

FIGS. 24 and 25 show electron current densities of a green organic EL element and a blue organic EL element, respectively, in the same manner as FIG. 23.

As shown in FIGS. 23 and 25, in an area of a residue, the electron current density in the IL layer is high compared to other regions, and it indicates that the residues acting as the parasitic capacitance film have an effect on the electron current density. In contrast, in a region not including residues, the electron current density in the IL layer is low. It indicates that carrier recombination adequately occurs in EML, and the number of electrons infiltrates in IL is small. Note that it was discovered that in a green organic EL element shown in FIG. 24, by the nature of it, the electron current density in the IL layer is relatively unchangeable regardless of the presence or absence of residues.

As described above, the effect of the present invention by appropriately controlling the area and the diameter of bank residues can be actually confirmed via measurement of distribution of electron current density in each layer constituting the organic EL element.

(Area Controlling Method and Confirmation Method of Bank Residues)

The size and area of bank residues can be controlled by adjusting each of irradiation conditions (parameters such as duration, intensity, range, etc. of irradiation) of UV projected on the bank residues. Regarding intensity and range of UV irradiation, there is a method of projecting UV on the substrate via pattern mask with predetermined openings, in addition to controlling intensity of a UV irradiation device. The pattern mask may be a mask having dot openings, etc., or a half-tone mask.

When a pattern mask is used, by setting different irradiation conditions for irradiation regions in one-to-one correspondence with the luminescent colors of RGB, it is possible to make the size and area of bank residues different for each luminescent color, for example. By minimizing the size and area of the bank residues in the irradiation region of the blue luminescent color having the highest electron mobility, and by setting relatively large the size and area of the bank residues in the irradiation regions of other luminescent colors, it is possible to shorten a time required for processing bank residues and positively suppress problems due to the bank residues.

Next, in order to check the shape, the size and area of the bank residues, the methods such as SIMS and TEM are used, for example. In particular, in the case of SIMS, the size and area of a whole bank residue can be calculated by measuring a plurality of peripheral points of the bank residue.

Alternatively, another method is to acquire the simulation result data of the above FIGS. 15-22 beforehand, then acquire measured data by using the actually manufactured organic EL panel, for example, and subsequently, to compare these data to determine whether they match or not. Based on the result of this, it is possible to set UV irradiation conditions to process bank residues as intended, or to indirectly confirm UV irradiation result.

<Manufacturing Method of Organic EL Panel 1>

Subsequently, an example of an overall method of manufacturing the organic EL panel 1 is described with reference to FIGS. 5A-9C.

Figure 5A:
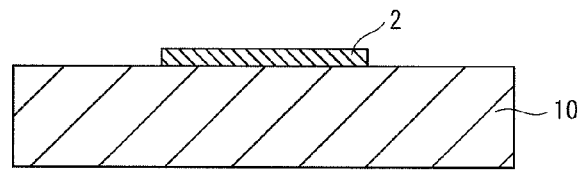
FIGS. 5A-5C are each a cross-sectional view of a manufacturing process of an organic EL panel.

First, a thin film of silver is formed by sputtering on the substrate 10. By patterning the thin film using photolithography, for example, a plurality of anodes 2 are formed in a matrix on the substrate 10 (FIG. 5A). Note that the thin film is not limited to be formed by sputtering, and other vacuum processes such as vacuum deposition method may be used.

Next, a thin ITO film is formed by sputtering or the like on the surface of the substrate 10 including the anodes 2. The formed thin ITO film is then patterned using the photolithography or the like to form the transparent conductive film 3.

Figure 5B:
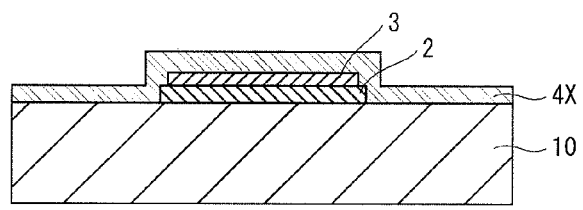

Subsequently, a metal oxide film 4X is formed by sputtering or the like on the entire surface of the substrate 10 on which the transparent conductive film 3 is formed (FIG. 5B).

Figure 5C:
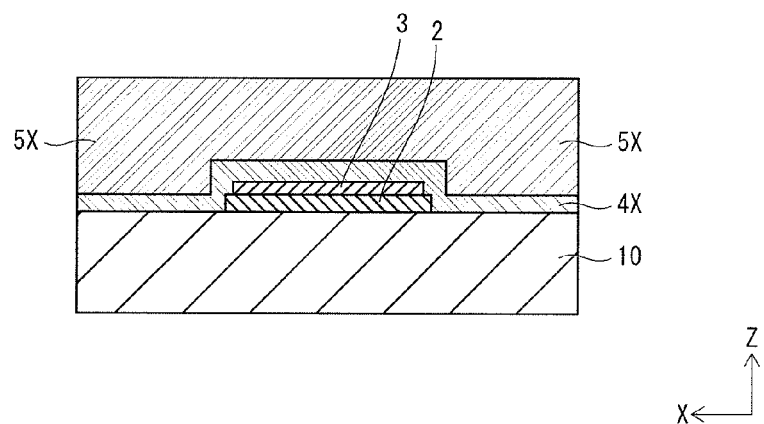

Subsequently, a bank material layer 5X is formed on the metal oxide film 4X with bank material composed of organic material (FIG. 5C). A portion of the bank material layer 5X is removed to expose a portion of the thin film 4X.

The bank material layer 5X may be formed, for example, by performing coating. The bank material layer 5X can be removed by patterning and cleaning with a predetermined developer (a solution of tetramethylammonium hydroxide (TMAH) or the like).

Figure 6A:
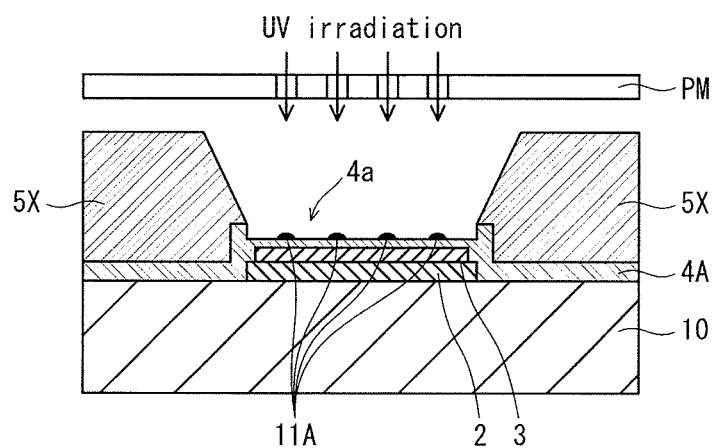
FIGS. 6A-6B are each a cross-sectional view of a manufacturing process of an organic EL panel.

While the metal oxide forming the metal oxide film 4X has good chemical resistance, it has the property of slightly dissolving in TMAH solution. Therefore, the TMAH solution slightly erodes the surface of the metal oxide film 4X, leading to formation of the hole-injection layer 4 (FIG. 6A). As a result of this, the hole-injection layer 4A is formed.

Next, repellency treatment is performed on the surface of the bank material layer 5X using fluorine plasma, for example, to form the banks 5.

Note that even after the development and cleaning with use of the developer, the bank residues 11A actually exist on the surface of the hole-injection layer 4A (see FIGS. 3A, 3B and 6A). At the present time, it is thought that the bank residues 11A exist over a large range.

In Embodiment 1, as shown in FIG. 6A, UV irradiation is performed on the surface of the hole-injection layer 4A that is partitioned by the banks 5, via a pattern mask PM having predetermined openings. The bank residues 11A can be removed and reduced by controlling intensity and duration of UV irradiation, the size of the openings of the pattern mask PM, etc. In this manner, the diameter of each bank residue 11A in one direction is set to be not greater than 0.2 μm when the substrate 10 is seen in plan view. Further, when the substrate 10 is seen in plan view, the area of each bank residue 11A can be set to be 0.4 μm$^2$, or preferably not greater than 0.04 μm$^2$.

Subsequently, an ink composition containing organic material is dripped, for example using a wet process such as the inkjet method, into a region partitioned by the banks 5. The ink is then dried, thereby forming the buffer layer 6A. At this time, the bank residues 11A are covered by the buffer layer 6A (see FIG. 1).

Figure 6B:
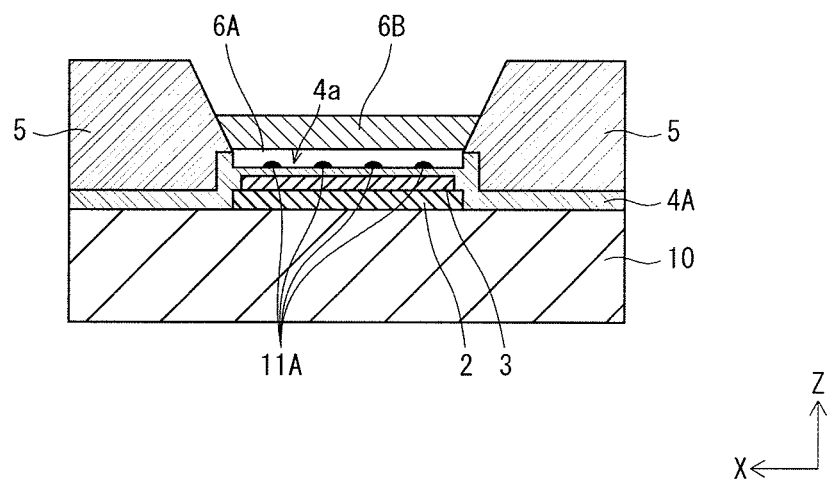

After that, the organic light-emitting layer 6B is formed by using the same wet process as above (FIG. 6B). The wet process may be a dispenser method, a nozzle-coat method, a spin coat method, an intaglio printing, a letter press printing, or the like.

Figure 7A:
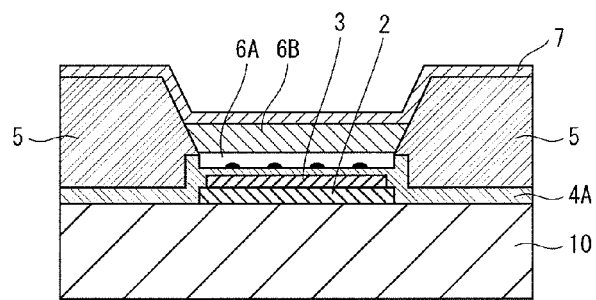
FIGS. 7A-7C are each a cross-sectional view of a manufacturing process of an organic EL panel.

Next, a barium thin film is formed on the entire surface of the substrate including the light-emitting layer 6B with vacuum deposition, for example. This barium thin film is used as the electron injection layer 7 (FIG. 7A).

Figure 7B:
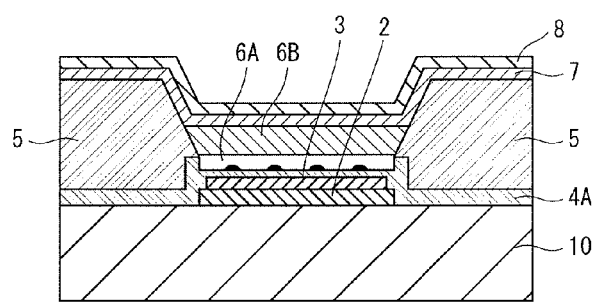
Figure 7C:
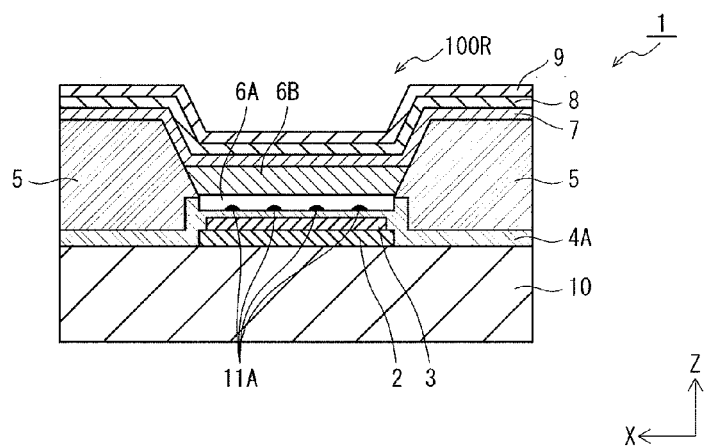

Subsequently, an ITO film is formed by sputtering or the like on the surface of the electron injection layer 7. This ITO film is the cathode 8 (FIG. 7B).

Next, on the surface of the cathode 8, a film of silicon nitride (SiN), silicon oxynitride (SiON), etc. material is formed by a thin film process to uniformly form the passivation layer 9 (FIG. 7C), thus completing the organic EL panel 1.

<Example of Another Process from Anode Forming Process to Bank Forming Process>

With reference to FIGS. 8 and 9, the following describes another example of a process from forming anode to forming bank.

Note that in this process, a planarizing film 17 is formed on the surface of the substrate 10 as an example of an alternative structure. However, forming the planarizing film 17 may be omitted. As a transparent conductive film, an IZO layer 3A is formed.

Figure 8A:
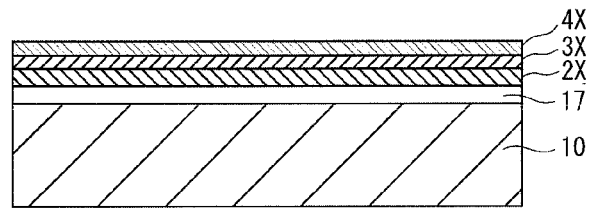
FIGS. 8A-8D are each a cross-sectional view of a manufacturing process of an organic EL panel.

First, a planarizing layer 17 is formed on the substrate 10 from an insulating resin material such as polyimide or acrylic, as shown in FIG. 8A. With the vapor deposition method, the following three layers are layered sequentially on the planarizing layer 17: an Al alloy thin film 2X, an IZO thin film 3X, and a thin film (tungsten oxide film) 4X. ACL (aluminum-cobalt-lanthanum) material, for example, is used as the Al alloy material.

Figure 8B:
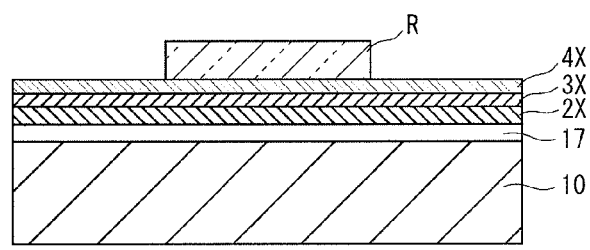

Next, a resist pattern R is formed by photolithography in the regions in which the anode 2, the IZO layer 3A, and the hole-injection layer 4B are to be formed (FIG. 8B).

Figure 8C:
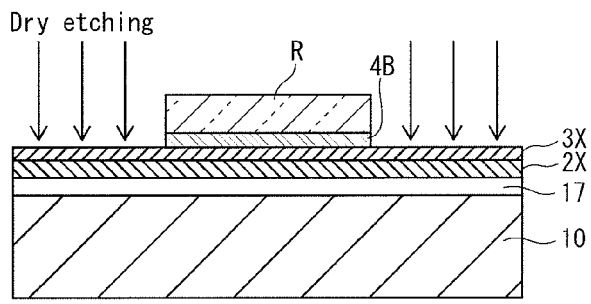

Next, patterning is performed by dry etching (D/E) of the regions of the thin film 4X not covered by the resist pattern R (FIG. 8C). During this dry etching, only the thin film 4X is selectively etched with either a mixture of fluorinated gas and N, gas, or a mixture of fluorinated gas and $O_2$ gas. The following is an example of specific setting conditions for the dry etching.

[Dry Etching Condition]
  Target of treatment: tungsten oxide film
  Etching gas: fluorine-containing gas ($SF_6$, $CF_4CHF_3$)
  Mixed gas: $O_2$, N,
  Mixed gas ratio: $CF_4:O_2=160: 40$
  Supplied power: Source 500 W, Bias 400 W
  Pressure: between 10 mTorr and 50 mTorr
  Etching temperature: room temperature Performing the above dry etching yields the hole-injection layer 4B. Subsequently, ashing is performed with 0, gas to facilitate removal of the resist pattern R during the following wet etching (W/E) process.

Figure 8D:
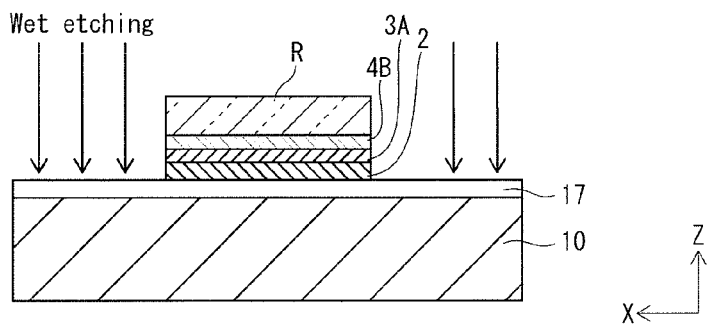

Via wet etching, the regions of the IZO thin film 3X and the Al alloy thin film 2X not covered by the resist pattern R are patterned (FIG. 8D). Using a mixed solution of containing nitric acid, phosphoric acid, acetic acid, and water as the etchant, wet etching is performed simultaneously on both the IZO thin film 3X and the Al alloy thin film 2X.

The following is an example of specific setting conditions for the wet etching.

[Conditions for Wet Etching]
  Target of treatment: IZO thin film and Al alloy thin film
  Etchant: mixed aqueous solution of nitric acid, phosphoric acid, and acetic acid
  Blend ratio of solvent: not specified (mixing is possible under typical conditions)
  Etching temperature: lower than room temperature Note that to perform the wet etching well, it is desirable that the IZO thin film, which is the uppermost layer, be a thickness of 20 nm or less. This is because the amount of side etching grows large if the thickness exceeds 20 nm.

Figure 9A:
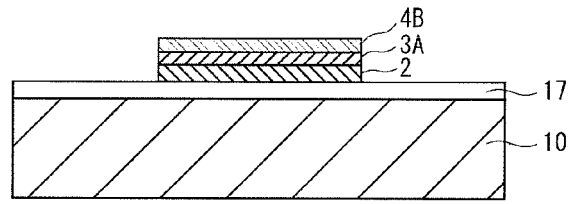
FIGS. 9A-9C are each a cross-sectional view of a manufacturing process of an organic EL panel.

The anode 2 and the IZO layer 3A are formed through the above processes. Subsequently, the resist pattern R is removed through a resist removing step, yielding a patterned triple layer structure composed of the anode 2, the IZO layer 3A, and the hole-injection layer 4B (FIG. 9A). During this process, the hole-injection layer 4B is formed in locations corresponding to the anode 2 and the IZO layer 3A.

Next, the bank material layer 5X is formed on the exposed surface of the planarizing layer 17 (not shown in the figures) and patterned. At this time, the bank material may be a negative photosensitive resin material or a positive photosensitive resin material, which includes acrylic, polyimide, etc. By exposing and developing the bank material using a pattern mask according to a negative photosensitive resin material or a positive photosensitive resin material, the unnecessary part of a photosensitive resin film is removed.

Next, the photosensitive resin film is irradiated with UV. The photosensitive resin film is melted and hardened by the UV irradiation, thus forming the banks 5 (FIG. 9B).

Figure 9B:
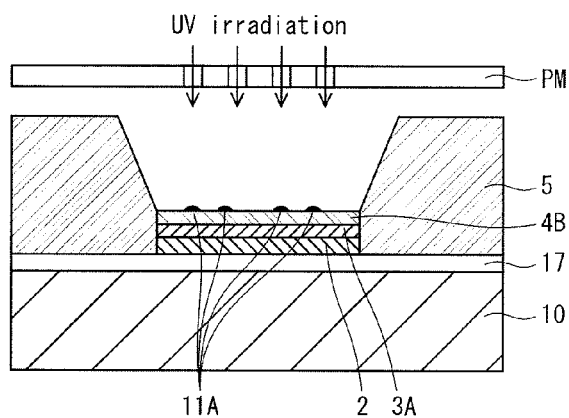

At this time, as shown in FIG. 9B, the bank residues 11A remain on the surface of the hole-injection layer 4B. Accordingly, the UV irradiation is appropriately performed by using the pattern mask PM in the same manner as above, so as to reduce the size and area of the bank residues 11A.

Figure 9C:
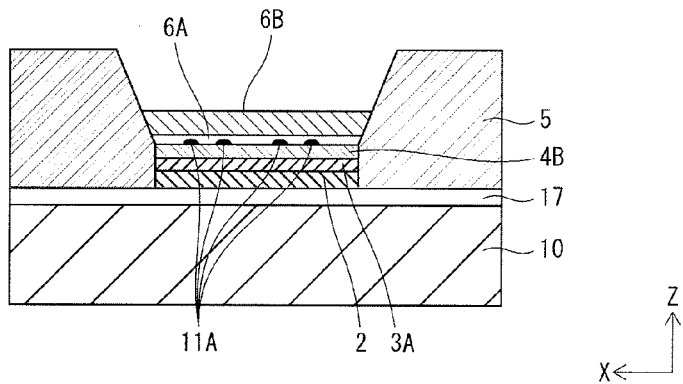

Subsequently, the buffer layers 6A and the light-emitting layer 6B can be formed with the above-described method, by adjusting the predetermined ink, dripping the ink successively into regions partitioned by the banks 5, and drying the ink (FIG. 9C).

<Manufacturing Method of Organic EL Panel 1A>

In the panel 1A, the anode 2 and the transparent conductive film 3 are layered sequentially on the surface of the substrate 10 by sputtering, in the same manner as above. After that, the bank material is uniformly applied on the substrate 10, and patterning is applied to form the banks 5.

At the present time, bank residues 11B remain on the transparent conductive film 3. Accordingly, the UV irradiation is performed so as to reduce the size and area of the bank residues 11B in the same manner as above (see FIG. 10).

Subsequently, ink including metal oxide material is applied on the surface of the transparent conductive film 3 between adjacent banks 5, and is dried to form the hole-injection layer 4B.

After that, the buffer layer 6A, the organic light-emitting layer 6B, the electron injection layer 7, the cathode 8 and the passivation layer 9 are formed in the same manner as the panel 1, thus completing the organic EL panel 1A.

<Embodiment 3>

Figure 11:
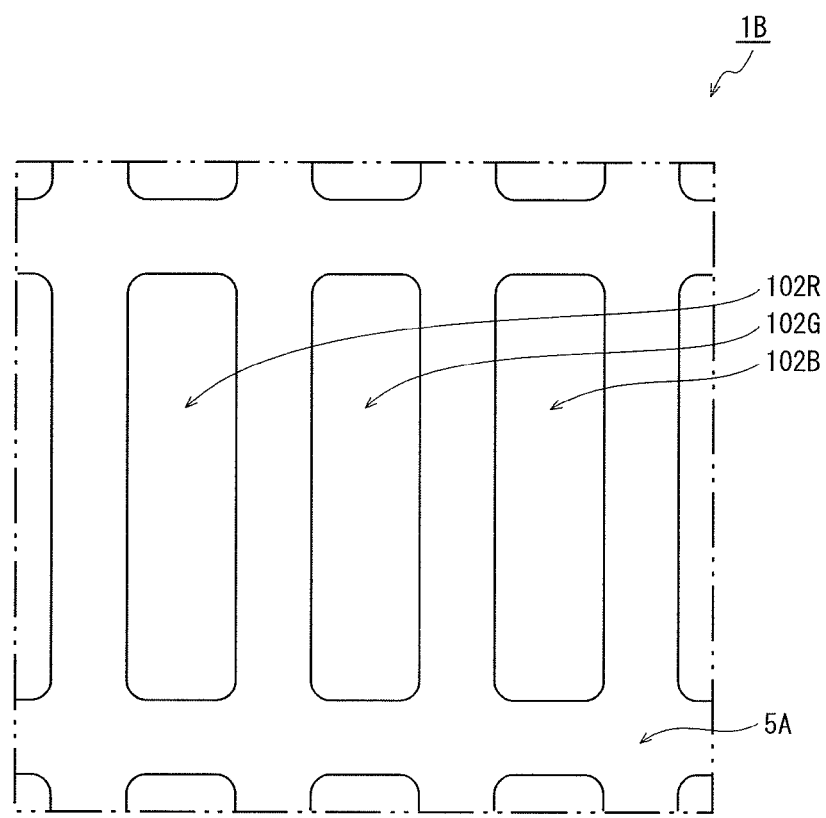
FIG. 11 is a front view of the schematic structure of an organic EL panel 1B pertaining to Embodiment 3.

FIG. 11 is a front view of an organic EL panel 1B pertaining to Embodiment 3 of the present invention.

When forming the organic EL panel of the present invention, the banks are not limited to have the line bank structure. The banks may have the pixel bank structure. FIG. 11 shows the structure of the organic EL panel 1B on which a pixel bank 5A having a lattice shape is disposed to partition the light-emitting layers 102R, 102G and 102B in the XY directions.

The organic EL panel 1B with this structure is expected to have almost the same effect as the organic EL panels 1 and 1A.

<Other Considerations>

The method of forming the hole-injection layer via the thin film process is not limited to the reactive sputtering method. For example, the vapor deposition method, the CVD method, or the like may be used instead.

The organic EL panel of the present invention may be applied to a lighting apparatus, for example, by making each element to project a single luminescent color.

The organic EL element of the present invention may have a hole transport layer as an IL layer between the hole-injection layer and the light-emitting layer. The hole transport layer has the function of transporting holes injected from the hole-injection layer to the light-emitting layer. The hole transport layer is made of hole transporting organic material. The hole transporting organic material transports generated holes by using intermolecular charge transfer reaction. This is also known as a p-type organic semiconductor.

The material for the hole transport layer may be either a high molecular material or a low molecular material, and the hole transport layer may be formed by wet printing, for example. When forming the light-emitting layer, which is the uppermost layer, it is desirable for the material for the hole transport layer to include a cross-linking agent so as not to mix with the material for the light-emitting layer. Examples of the material for the hole transport layer are a copolymer that includes a fluorene region and a triarylamine region, and a triarylamine derivative with a low molecular weight. Examples of a cross-linking agent may include dipentaerythritol hexaacrylate and the like. In this case, it is desirable that the cross-linking agent be formed from poly(3, 4-ethylenedioxythiophene) doped with polystyrene sulfonic acid (PEDOT: PSS) or a derivative thereof (a copolymer or the like).

In the case where the bank forming process is performed after forming the hole transport layer, bank residues remain on the surface of the hole transport layer. Accordingly, in this case, UV irradiation is performed in the same manner as above, and the size and area of the bank residues are appropriately controlled. In the above embodiments, although organic material is used as a bank material, inorganic material may also be used. In this case, the bank material layer is formed, for example, by performing coating, in the same manner as the case of using organic material. The bank material layer can be patterned by forming a resist pattern on the bank material layer and then performing etching with a predetermined etchant (a solution of tetramethylammonium hydroxide (TMAH) or the like).

[Industrial Applicability]

The organic EL display panel in the present invention is appropriate as a display element such as a cellular telephone display, a television, etc., or in a variety of light sources. Regardless of the specific use thereof, the organic EL display panel can be used as an organic EL display panel driven at a low voltage while exhibiting a wide range of luminous intensity, from low luminous intensity to high luminous intensity. The organic EL element of the present invention, for having such a high level of performance, may be used in a wide range of applications, including those for household use, those for use in public facilities, and those for professional use. More specifically, such applications include: various display apparatuses; TV apparatuses; displays for portable electronic devices; illumination light sources, and etc.

REFERENCE SIGNS LIST 1, 1A, 1B organic EL panel
2. first electrode (anode)
3 transparent conductive film
4A thin film type hole-injection layer (HIL)
4B application type hole-injection layer (HIL)
4X metal oxide film
5 bank (line bank structure)
5A bank (pixel bank structure)
5X bank material layer
6A buffer layer (IL)
6B organic light-emitting layer (EML)
7 electron transport layer (ETL)
8 second electrode (cathode)
9 passivation layer
10 substrate
11A, 11B bank residue
100R, 100B, 100G, 101R, 102R, 102B, 102G organic EL element

The invention claimed is:

1. An organic EL panel, comprising:
a substrate;
a plurality of first electrodes disposed above the substrate along a first direction and a second direction, the first direction and the second direction intersecting each other;
organic light-emitting layers each disposed above one of the first electrodes and including organic light-emitting material;
banks partitioning the organic light-emitting layers either individually or into groups; and
a second electrode that is configured to follow a cavity between banks, and is disposed over the organic light-emitting layers and over the banks,
wherein a plurality of bank residues remain between the first electrodes and the organic light-emitting layers, and a diameter of each bank residue in one direction in plan view of a surface of the substrate is not greater than 0.2 µm.

2. The organic EL panel of claim 1,
wherein an area occupied by each bank residue in plan view of the surface of the substrate is not greater than 0.4 µm².

3. The organic EL panel of claim 2,
wherein the area occupied by each bank residue is not greater than 0.04 µm².

4. The organic EL panel of claim 1, further comprising:
a hole-injection layer,
wherein the hole-injection layer is disposed between the first electrodes and the organic light-emitting layers, and the bank residues exist on a surface of the hole-injection layer.

5. The organic EL panel of claim 1,
wherein the bank residues exist on a surface of each first electrode.

6. The organic EL panel of claim 1, further comprising:
a hole-injection layer,
wherein the hole-injection layer is disposed between the first electrodes and the organic light-emitting layers, and the hole-injection layer covers the bank residues.

7. The organic EL panel of claim 1, further comprising:
a buffer layer,
wherein the buffer layer is disposed between the first electrodes and the organic light-emitting layers, and the buffer layer covers the bank residues.

8. The organic EL panel of claim 1,
wherein the organic light-emitting layers include adjacent first, second and third organic light-emitting layers, and groups of the first, second and third organic light-emitting layers are repeatedly disposed in the second direction above the first electrodes, the first, second and third organic light-emitting layers being different from one another in luminescent color, and the diameter of a bank residue, existing below one of the first, second and third organic light-emitting layers, that has a highest electron mobility has a smallest diameter.

9. The organic EL panel of claim 8,
wherein the one organic light-emitting layer that has the highest electron mobility has a blue luminescent color.

10. A manufacturing method of an organic EL panel, the method comprising:

preparing a substrate;

forming a plurality of first electrodes above the substrate along a first direction and a second direction, the first direction and the second direction intersecting each other;

forming banks above the first electrodes;

forming organic light-emitting layers each disposed above one of the first electrodes and including organic light-emitting material; and forming a second electrode that is configured to follow a cavity between banks, and is disposed over the organic light-emitting layers and over the banks, the second electrode being different from the first electrode in polarity, and the manufacturing method further comprises the step of treating bank residues, after forming the banks and before forming the organic light-emitting layers, by irradiating bank residues existing above the first electrodes with ultra violet to reduce a diameter of each bank residue in one direction to not greater than 0.2 μm.

11. The manufacturing method of claim 10,
wherein in the treatment of the bank residues, an area occupied by each bank residue in plan view of a surface of the substrate is reduced to not greater than 0.4 $\mu m^2$.

12. The manufacturing method of claim 11,
wherein in the treatment of the bank residues, an area occupied by each bank residue in plan view of the surface of the substrate is reduced to not greater than 0.04 $\mu m^2$.

* * * * *